(12) United States Patent
Ueng et al.

(10) Patent No.: US 8,549,375 B2
(45) Date of Patent: Oct. 1, 2013

(54) DECODER AND DECODING METHOD FOR LOW-DENSITY PARITY CHECK CODES CONSTRUCTED BASED ON REED-SOLOMON CODES

(75) Inventors: Yeong-Luh Ueng, Jinning Township, Kinmen County (TW); Kuan-Chieh Wang, Taipei (TW); Chun-Jung Chen, Tainan (TW); Tsung-Chieh Yang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 504 days.

(21) Appl. No.: 12/945,597

(22) Filed: Nov. 12, 2010

(65) Prior Publication Data

US 2011/0126078 A1    May 26, 2011

(30) Foreign Application Priority Data

Nov. 23, 2009 (TW) ................................ 98139768 A

(51) Int. Cl.
*H04L 1/00* (2006.01)
(52) U.S. Cl.
USPC ............................ 714/752; 714/758; 714/784
(58) Field of Classification Search
USPC .......................................... 714/752, 758, 784
See application file for complete search history.

(56) References Cited

U.S. PATENT DOCUMENTS

| | | | | |
|---|---|---|---|---|
| 7,549,105 B2 * | 6/2009 | Shen et al. | ..................... | 714/755 |
| 8,145,970 B2 * | 3/2012 | Lee et al. | ..................... | 714/751 |
| 8,181,085 B2 * | 5/2012 | Eroz et al. | ..................... | 714/758 |
| 8,196,010 B1 * | 6/2012 | Gunnam et al. | ............... | 714/758 |
| 8,351,541 B2 * | 1/2013 | Taylor et al. | .................. | 375/295 |
| 8,402,337 B2 * | 3/2013 | Yokokawa et al. | ........... | 714/752 |

OTHER PUBLICATIONS

A. Darabiha et al., "Block-Interlaced LDPC Decoders With Reduced Interconnect Complexity", IEEE Trans. Circuits. Syst. II, Exp. Briefs, vol. 55, No. 1, pp. 74-78, Jan. 2008.
A. Darabiha et al., "Power Reduction Techniques for LDPC Decoders", IEEE Transactions on very Large Scale Integration Systems, vol. 43, No. 8, pp. 1835-1845, Aug. 2008.
A. J. Blanksby et al., "A 690-mW 1-Gb/s 1024-b, Rate-½ Low-Density Parity-Check Code Decoder", IEEE J. Solid-State Circuits, vol. 37, No. 3, pp. 404-412, Mar. 2002.
C. H. Liu et al., "Multi-mode Message Passing Switch Networks Applied for QC-LDPC Decoder", in Proc. IEEE ISCAS 2008, pp. 752-755, May 2008.
D. E. Hocevar, "A Reduced Complexity Decoder Architecture Via Layered Decoding of LDPC Codes", in Proc. IEEE Workshop on Signal Processing Systems, pp. 107-112, Oct. 2004.

(Continued)

*Primary Examiner* — Joseph Schell
(74) *Attorney, Agent, or Firm* — Birch, Stewart, Kolasch & Birch, LLP

(57) ABSTRACT

Configurable permutators in an LDPC decoder are provided. A partially-parallel architecture combined with the proposed permutators is used to mitigate the increase in implementation complexity for the multi-mode function. To overcome the difficulty in efficient implementation of a high-throughput decoder, the variable nodes are partitioned into several groups, and each group is processed sequentially in order to shorten the critical-path delay and, hence, increase the maximum operating frequency. In addition, shuffled message-passing decoding can be adopted in decoders according to the invention to increase the convergence speed, which reduces the number of iterations required to achieve a given bit-error-rate performance.

16 Claims, 9 Drawing Sheets

(56) References Cited

OTHER PUBLICATIONS

D. J. C. MacKay, "Good Error-Correcting Codes Based on Very Sparse Matrices," IEEE Trans. Inf. Theory, vol. 45, No. 2, pp. 399-431, Mar. 1999.

D. Oh et al., "Area Efficient Controller Design of Barrel Shifters for Reconfigurable LDPC Decoders", in Proc. IEEE ISCAS 2008, pp. 240-243, May 2008.

F. Guilloud et al., "Generic description and synthesis of LDPC decoders", IEEE Trans. Commun., vol. 55, No. 11, pp. 2084-2091, Nov. 2007.

G. Liva et al., "Design of LDPC Codes: A Survey and New Results", J. Commun. Softw. Syst., vol. 2, No. 3, pp. 191-211, Sep. 2006.

G. Masera et al., "Implementation of a Flexible LDPC Decoder", IEEE Trans. Circuits. Syst. II, Exp. Briefs, vol. 54, No. 6, pp. 542-546, Jun. 2007.

H. Zhong et al., "Area-Efficient Min-Sum Decoder Design for High-Rate Quasi-Cyclic Low-Density Parity-Check Codes in Magnetic Recording", IEEE Trans. Magn., vol. 43, No. 12, pp. 4117-4122, Dec. 2007.

I. Djurdjevic et al., "A Class of Low-Density Parity-Check Codes Constructed Based on Reed-Solomon Codes With Two Information Symbols", IEEE Commun. Lett., vol. 7, No. 7, pp. 317-319, Jul. 2003.

J. Chen et al., "Density Evolution for Two Improved BP-Based Decoding Algorithms of LDPC Codes", IEEE Commum. Lett., vol. 6, No. 5, pp. 208-210, May 2002.

J. Lin et al., "Efficient Shuffle Network Architecture and Application for WiMAX LDPC Decoders", IEEE Trans. Circuits. Syst. II, Exp. Briefs, vol. 56, No. 3, pp. 215-219, Mar. 2009.

J. Sha et al., "Decoder Design for RS-Based LDPC Codes", IEEE Trans. Circuits. Syst. II, Exp. Briefs, vol. 56, No. 9, pp. 724-728, Sep. 2009.

J. Sha et al., "Multi-Gb/s LDPC Code Design and Implementation", IEEE Trans. Very Large Scale Integr. (VLSI) Syst., vol. 17, No. 2, pp. 262-268, Feb. 2009.

J. Tang et al., "Reconfigurable Shuffle Network Design in LDPC Decoders", in Proc. IEEE 2006 Application-specific Systems, Architectures and Processors, pp. 81-86, Sep. 2006.

J. Zhang et al., "Iterative Decoding with Replicas", IEEE Trans. Inf. Theory, vol. 53, No. 5, pp. 1644-1663, May 2007.

J. Zhang et al., "Shuffled Iterative Decoding", IEEE Trans. Commun, vol. 53, No. 2, pp. 209-213, Feb. 2005.

K. K. Gunnam et al., "VLSI Architectures for Layered Decoding for Irregular LDPC Codes of WiMAX", in Proc. IEEE Int. Conf. Commun., pp. 4542-4547, 2007.

L. Liu et al., "Sliced Message Passing: High Throughput Overlapped Decoding of High-Rate Low-Density Parity-Check Codes", IEEE Trans. Circuits Syst. I, Reg. Papers, vol. 55, No. 11, pp. 3697-3710, Dec. 2008.

M. Alles et al., "FlexiChaP: A Reconfigurable ASIP for Convolutional, Turbo, and LDPC Code Decoding", in Proc. International Symposium on Turbo Codes and Related Topics, pp. 84-89, Sep. 2008.

M. Cocco et al., "A Scalable Architecture for LDPC Decoding", in Proc. Design, Automation and Test in Europe Conference and Exhibition vol. 3, pp. 88-93, Feb. 2004.

M. Fossorier et al., "Reduced Complexity Iterative Decoding of Low-Density Parity-Check Codes Based on Belief Propagation", IEEE Trans. Commum., vol. 47, No. 5, pp. 673-680, May 1999.

M. Karkooti et al., "Configurable, High Throughput, Irregular LDPC Decoder Architecture: Tradeoff Analysis and Implementation", in Proc. IEEE 2006 Application-specific Systems, Architectures and Processors, pp. 360-367, Sep. 2006.

M. M. Mansour et al., "High-Throughput LDPC Decoders", IEEE Trans. Very Large Scale Integr. (VLSI) Syst., vol. 11, No. 6, pp. 976-996, Dec. 2003.

M. Rovini et al., "Layered Decoding of Non-Layered LDPC Codes", in Proc. Euromicro Conference on Digital System Design, pp. 537-544, Aug. 2006.

N. Onizawa et al., "Design of High-Throughput Fully Parallel LDPC Decoders Based on Wire Partitioning", IEEE Trans. Very Large Scale Integr. (VLSI) Syst., vol. 18, No. 3, Mar. 2010.

R. Gallager, "Low-Density Parity-Check Codes", IRE Trans. Inf. Theory, vol. 7, pp. 21-28, Jan. 1962.

R. M. Tanner, "A Recursive Approach to Low-Complexity Codes", IEEE Trans. Inf. Theory, vol. 27. No. 5, pp. 533-547, Sep. 1981.

S. S. Tehrani et al., "Fully Parallel Stochastic LDPC Decoders", IEEE Trans. Signal Processing, vol. 56, No. 11, pp. 5692-5703, Nov. 2008.

T. Brack et al., "A Synthesizable IP Core for WiMAX 802.16E LDPC Code Decoding", in Proc. IEEE Annual International Symposium on Personal Indoor and Mobile Radio Communications (PIMRC 2006), Helsinki, Finland, Sep. 2006.

T. Brack et al., "Low Complexity LDPC Code Decoders for Next Generation Standards", in Proc. Des., Autom. Test Eur. (Date '07), Apr. 2007.

T. Brandon et al., "A scalable LDPC decoder ASIC architecture with bit-serial message exchange", Integration, the VLSI, vol. 41, No. 3, pp. 385-398, May 2008.

T. C. Kuo et al., "Enhanced Delta-Based Layered Decoding of WiMAX QC-LDPC Codes", in Proc. IEEE ISCAS 2008, pp. 524-268, May 2008.

T. Mohsenin et al., "Multi-Split-Row Threshold Decoding Implementations for LDPC Codes", in Proc. IEEE ISCAS 2009, pp. 2449-2452, May 2009.

X.-Y. Shih et al., "An 8.29 mm2 52 mW Multi-Mode LDPC Decoder Design for Mobile WiMAX System in 0.13 • m CMOS Process", IEEE J. Solid-State Circuits, vol. 43, No. 3, pp. 672-683, Mar. 2008.

Y. L. Ueng et al., "A shuffled message-passing decoding method for memory-based LDPC decoders", in Proc. IEEE ISCAS 2009, pp. 892-895, May 2009.

Y. L. Ueng et al., "A Multi-mode Shuffled Iterative Decoder Architecture for High-rate RS-LDPC Codes", IEEE Trans. on Circuits and Systems-I: Regular Papers, pp. 1-14.

Z. Cui et al., "Efficient Decoder Design for High-Throughput LDPC Decoding", in Proc. IEEE Asia Pacific Conf. on Circuits and Syst., pp. 1640-1643, Dec. 2008.

Z. Cui et al., "High-Throughput Layered LDPC Decoding Architecture", IEEE Trans. Very Large Scale Integr. (VLSI) Syst., vol. 17, No. 4, pp. 582-587, Apr. 2009.

Z. Zhang et al., "A 47 Gb/s LDPC Decoder with Improved Low Error Rate Performance", in 2009 IEEE VLSI Circuits Symposium, Kyoto, Japan, Jun. 2009.

Z. Zhang, et al., "Investigation of Error Floors of Structured Low-Density Parity-Check Codes by Hardware Emulation", in Proc. IEEE GLOBECOM 2006, San Francisco, Nov. 2006.

* cited by examiner $$H'_{12\times 3} = \begin{bmatrix} 0 & 0 & 0 \\ 1\times\alpha & 1\times\alpha^2 & 1 \\ \alpha\times\alpha & \alpha\times\alpha^2 & \alpha \\ \alpha^2\times\alpha & \alpha^2\times\alpha^2 & \alpha^2 \\ \hline \alpha & 1 & 0 \\ \alpha(1+\alpha^0) & (1+\alpha^2) & 1 \\ \alpha(1+\alpha^1) & (1+\alpha^0) & \alpha \\ \alpha(1+\alpha^2) & (1+\alpha^1) & \alpha^2 \\ \hline \alpha\times\alpha & \alpha\times 1 & 0 \\ \alpha^2(1+\alpha^2) & \alpha(1+\alpha^1) & 1 \\ \alpha^2(1+\alpha^0) & \alpha(1+\alpha^2) & \alpha \\ \alpha^2(1+\alpha^1) & \alpha(1+\alpha^0) & \alpha^2 \end{bmatrix} \begin{matrix} c_{1,\infty} \\ c_{1,0} \\ c_{1,1} \\ c_{1,2} \\ c_{2,\infty} \\ c_{2,0} \\ c_{2,1} \\ c_{2,2} \\ c_{3,\infty} \\ c_{3,0} \\ c_{3,1} \\ c_{3,2} \end{matrix}$$

FIG. 1

Type I

$$H_{12\times 12} = \begin{bmatrix} 1 & 0 & 0 & 0 & 1 & 0 & 0 & 0 & 1 & 0 & 0 & 0 \\ 0 & 0 & 1 & 0 & 0 & 0 & 0 & 1 & 0 & 1 & 0 & 0 \\ 0 & 0 & 0 & 1 & 0 & 1 & 0 & 0 & 0 & 0 & 1 & 0 \\ 0 & 1 & 0 & 0 & 0 & 0 & 1 & 0 & 0 & 0 & 0 & 1 \\ 0 & 0 & 1 & 0 & 0 & 1 & 0 & 0 & 1 & 0 & 0 & 0 \\ 1 & 0 & 0 & 0 & 0 & 0 & 1 & 0 & 0 & 1 & 0 & 0 \\ 0 & 1 & 0 & 0 & 1 & 0 & 0 & 0 & 0 & 0 & 1 & 0 \\ 0 & 0 & 0 & 1 & 0 & 0 & 0 & 1 & 0 & 0 & 0 & 1 \\ 0 & 0 & 0 & 1 & 0 & 0 & 1 & 0 & 1 & 0 & 0 & 0 \\ 0 & 1 & 0 & 0 & 0 & 1 & 0 & 0 & 0 & 1 & 0 & 0 \\ 1 & 0 & 0 & 0 & 0 & 0 & 0 & 1 & 0 & 0 & 1 & 0 \\ 0 & 0 & 1 & 0 & 1 & 0 & 0 & 0 & 0 & 0 & 0 & 1 \end{bmatrix} \begin{matrix} \left.\begin{matrix} \\ \\ \\ \\ \end{matrix}\right\} A_1 \\ \left.\begin{matrix} \\ \\ \\ \\ \end{matrix}\right\} A_2 \\ \left.\begin{matrix} \\ \\ \\ \\ \end{matrix}\right\} A_3 \end{matrix}$$

Type III        Type II

FIG. 2

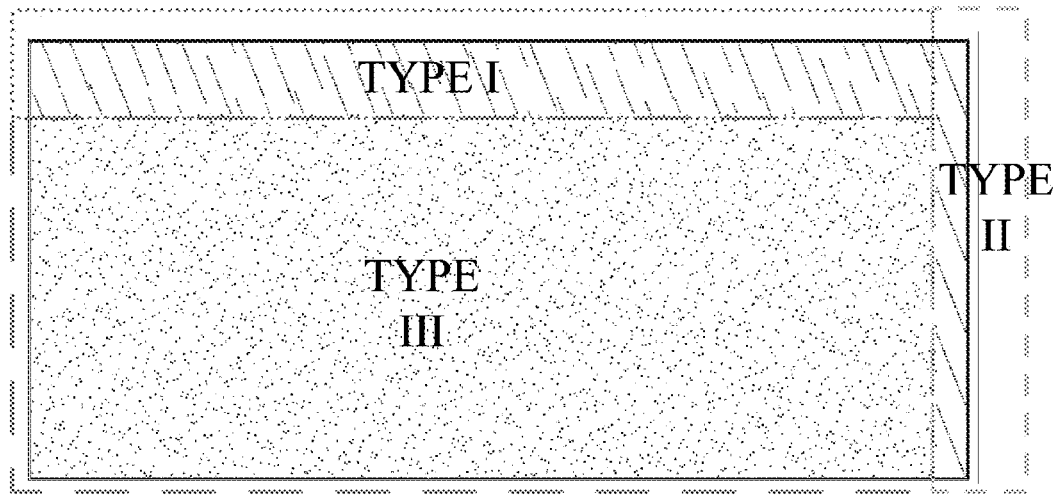

FIG. 5

$$\mathbf{H}'_{12\times3} = \begin{bmatrix} 0 & 0 & 0 \\ 1\times 1 & 1\times\alpha^1 & 1 \\ \alpha^1\times 1 & \alpha^1\times\alpha^1 & \alpha^1 \\ \alpha^2\times 1 & \alpha^2\times\alpha^1 & \alpha^2 \\ \hline \alpha^0 & \alpha^0 & 0 \\ \alpha^0(1+\alpha^0) & \alpha^0(1+\alpha^1) & 1 \\ \alpha^0(1+\alpha^1) & \alpha^0(1+\alpha^2) & \alpha^1 \\ \alpha^0(1+\alpha^2) & \alpha^0(1+\alpha^0) & \alpha^2 \\ \hline \alpha^1 & \alpha^1 & 0 \\ \alpha^1(1+\alpha^2) & \alpha^1(1+\alpha^0) & 1 \\ \alpha^1(1+\alpha^0) & \alpha^1(1+\alpha^1) & \alpha^1 \\ \alpha^1(1+\alpha^1) & \alpha^1(1+\alpha^2) & \alpha^2 \end{bmatrix}$$

FIG. 6

| $\Phi_{i,w}$ | $\|Q_{j_0,i}\|$ | $\|Q_{j_1,i}\|$ | $\|Q_{j_2,i}\|$ |
|---|---|---|---|
| $J_{i,w}$ | $j_0$ | $j_1$ | $j_2$ |

At the end of (k-1)-th iteration :

| 0.1 | 0.2 | 0.3 |
|---|---|---|
| 1 | 2 | 3 |

At the k-th iteration for group 1 :
At the CN-R stage $$|R'_{i,1}[k-1]| = 0.2$$

At the VN stage, suppose $$|Q_{1,i}[k]| = 0.4$$

At the CN-S stage

| 0.2 | 0.3 | 0.4 |
|---|---|---|
| 2 | 3 | 1 |

At the CN-R stage for group 2

$$|R'_{i,2}[k-1]| = 0.3$$

$$\omega = 3$$

FIG. 9(a)

| $\|Q_{j_0,i}\|$ | $\|Q_{j_1,i}\|$ |
|---|---|
| $j_0$ | $j_1$ |

| 0.1 | 0.2 |
|---|---|
| 1 | 2 |

$$|R'_{i,1}[k-1]| = 0.2$$

$$|Q_{1,i}[k]| = 0.4$$

| 0.2 | 0.4 |
|---|---|
| 2 | 1 |

$$|R'_{i,2}[k-1]| = 0.4$$

$$\omega = 2$$

FIG. 9(b)

```
1: Initialization:
2: $J_{i,\omega} = \phi, i \in \{0, 1, ..., M-1\}$
3: $\Phi_{i,\omega} = \{L_M, L_M, \cdots, L_M\}, i \in \{0, 1, ..., M-1\}$
4: for all $k = 1$ to $N_{it}$ do
5:    for all $g = 0$ to $g = G - 1$ do
6:       $\forall j \in \{g \cdot N_G, g \cdot N_G + 1, \cdots, (g+1) \cdot N_G - 1\}$
7:       if $k = 1$ then
8:          $R_{ij}[k-1] = 0$
9:       else
10:         {CN-R stage}
11:         Calculate $R_{ij}[k-1]$ using $|Q_{j_0 i}|, |Q_{j_1 i}|, j_0, S_{T,i}$, and
             $Sgn(Q_{ji}), \forall i \in I_C[j]$
12:      end if
13:      {VN stage}
14:      Calculate $Q_{ji}[k]$ using (15), $\forall i \in I_C[j]$
15:      if $k = N_{it}$ then
16:         Make a hard decision based on the sign of $\Lambda_j[k]$
17:      else
18:         {CN-S stage}
19:         $\forall i \in I_C[j]$
20:         if $j \in J_{i,\omega}$ then
21:            Replace $|Q_{ji}[k-1]|$ in $\Phi_{i,\omega}$ by $|Q_{ji}[k]|$
22:            Update $\Phi_{i,\omega}$ by reordering the elements in $\Phi_{i,\omega}$
23:         else
24:            Compare $|Q_{ji}[k]|$ with the elements in $\Phi_{i,\omega}$ to obtain
               $\Phi_{i,\omega+1}$ and $J_{i,\omega+1}$
25:            Discard the largest element in $\Phi_{i,\omega+1}$ to obtain $\Phi_{i,\omega}$ and
               $J_{i,\omega}$
26:         end if
27:         Update $S_{T,i}$
28:      end if
29:   end for
30: end for
```

FIG. 14

DECODER AND DECODING METHOD FOR LOW-DENSITY PARITY CHECK CODES CONSTRUCTED BASED ON REED-SOLOMON CODES

BACKGROUND OF THE INVENTION

1. Field of the Invention

The present invention is related to decoders in communication systems and storage systems. More specifically, the present invention relates to decoders and decoding methods for low-density parity check codes constructed based on Reed-Solomon codes.

2. Description of the Prior Art

Research into low-density parity-check (LDPC) codes has attracted a tremendous amount of interest as a result of their near-capacity performance and their potential for highly-parallel decoder implementation. LDPC codes for several applications such as optical communications, and image transmission over wireless channels have previously been discussed. Many recent communication standards, such as IEEE 802.3an and 802.16e (WiMAX) have included LDPC codes. The LDPC code adopted in IEEE 802.3an is a regular code which is constructed based on a Reed-Solomon (RS) code with two information symbols. Construction methods of LDPC codes based shortened RS codes and extended RS codes were presented in "A class of low-density parity-check codes constructed based on Reed-Solomon codes with two information symbols" reported by I. Djurdjevic on IEEE Commun. Lett., vol. 7, no. 7, pp. 317-319, July 2003 and "Design of LDPC codes: A survey and new results" reported by G. Liva on J. Commun. Softw. Syst., vol. 2, no. 3, pp. 191-211, September 2006. The minimum Hamming distance of an RS-LDPC code is guaranteed and RS-LDPC codes with large minimum distances can be constructed. The (2048, 1723) RS-LDPC code adopted in IEEE 802.3an standard has an error floor of $10^{-13}$ which can meet the requirement of the standard. High-rate codes such as the (2048, 1723) code are often used for applications with relatively low-noise channels, where as many message bits as possible are required to be transmitted within a finite bandwidth. High-rate codes are usually used in wire-line communications such as the 802.3an and the storage systems such as the hard-disk drives. For these applications, high data throughput (>1 Gbit/s) is usually required.

An LDPC code can be decoded by performing message-passing decoding (MPD) through its Tanner graph, which is a bipartite graph consisting of variable nodes and check nodes. In "Low-density parity-check Codes" reported by R. Gallager on IRE Trans. Inf. Theory, vol. 7, pp. 21-28, January 1962 and "Good error correcting codes based on very sparse matrices" reported by D. J. C. Mackay on IEEE Trans. Inf. Theory, vol. 45, no. 2, pp. 399-431, March 1999, a decoding schedule called two-phase message passing (TPMP), which divides the decoding operations in one iteration into check-node-operation and variable-node-operation phases, is used. Layered MPD and shuffled MPD can be used to increase the convergence speed in bit-error-rate (BER) performance and, hence, reduce the number of iterations required to achieve a given BER performance.

To implement a high-throughput decoder, a fully-parallel architecture can be adopted, but with complex inter-connections. In order to reduce the routing complexity, a bit-serial architecture or a stochastic decoder can be used. The technique of wire partitioning can be used to shorten the critical-path delay and further increase the throughput. The decoders presented in "A 690-mW 1-Gb/s 1024-b, rate-½ low-density parity-check code decoder" reported by A. J. Blanksby on IEEE J. Solid-State Circuits, vol. 37, no. 3, pp. 404-412, March 2002, "A scalable LDPC decoder ASIC architecture with bit-serial message exchange" reported by T. Brandon on Integration, vol. 41, no. 3, pp. 385-398, May 2008, "Fully parallel stochastic LDPC decoders" reported by S. S. Tehrani on IEEE Trans. Signal Processing, vol. 56, no. 11, pp. 5692-5703, November 2008, and "Design of high-throughput fully parallel LDPC decoders based on wire partitioning" reported by N. Onizawa, on IEEE Trans. Very Large Scale Integr. (VLSI) Syst. are single-mode rate-½ LDPC decoders, where the check-node degrees are low, e.g., 6. Fully-parallel decoders for a high-rate 2048-bit (6, 32)-regular LDPC code, where the variable-node and check-node degrees are 6 and 32, respectively, were presented in "Power reduction techniques for LDPC decoders" reported by A. Darabiha on IEEE J. Solid-State Circuits, vol. 43, no. 8, pp. 1835-1845, August 2008, "Block-interlaced LDPC decoders with reduced interconnect complexity" reported by A. Darabiha on IEEE Trans. Circuits. Syst. II, Exp. Briefs, vol. 55, pp. 74-78, January 2008, and "Multi-split-row threshold decoding implementations for LDPC codes" reported by T. Mohsenin, in Proc. IEEE ISCAS 2009, pp. 2449-2452, May 2009. In "Sliced message passing: high throughput overlapped decoding of high-rate low-density parity-check codes" reported by L. Liu on IEEE Trans. Circuits Syst. I, Reg. Papers, vol. 55, no. 11, pp. 3697-3710, December 2008, the authors showed that the high check-node degree leads to greater complexities in hardware, interconnect, and timing, which are difficult to manage using a fully-parallel architecture. Consequently, they proposed sliced message passing (SMP), which is a register-based partially-parallel architecture, to design a high-throughput decoder for the (6, 32)-regular LDPC code. The complexity of the silicon-area for a fully-parallel LDPC decoder grows quickly as the code length increases. Consequently, long LDPC decoders with high check-node degrees were designed using partially-parallel architectures. However, most of these high-throughput decoders are based on TPMP, which cannot increase the convergence speed in BER performance.

A memory-shared partially-parallel architecture is more suitable for a multi-mode decoder, since most hardware resources can be shared among different modes. A partially-parallel architecture can be combined with layered MPD so as to increase the convergence speed. Many multi-mode decoders for WiMAX LDPC codes are implemented using memory-shared architectures based on a layered MPD. To implement a multi-mode decoder for quasi-cyclic (QC) LDPC codes, such as those specified in WiMAX, the permutators must be efficiently shared among different modes in order to reduce the implementation complexity. In "Configurable, high throughput, irregular LDPC decoder architecture tradeoff analysis and implementation" reported by M. Karkooti in Proc. IEEE 2006 Application-specific Systems, Architectures and Processors, pp. 360-367, September 2006, the authors proposed a multi-mode decoder architecture using flexible barrel shifters. In "Reconfigurable shuffle network design in LDPC decoder" reported by J. Tang, in Proc. IEEE 2006 Application-specific Systems, Architectures and Processors, pp. 81-86, September 2006, "Area efficient controller design of barrel shifters for reconfigurable LDPC decoders" reported by D. Oh in Proc. IEEE ISCAS 2008, pp. 240-243, May 2008, "Multi-mode message passing switch networks applied for QC-LDPC decode" reported by C. H. Liu in Proc IEEE ISCAS 2008, pp. 752-755, May 2008, and "Efficient shuffle network architecture and application for WiMAX LDPC decoders" reported by J. Lin, on IEEE Trans. Circuits.

Syst. II, Exp. Briefs, vol. 54, no. 3, pp. 215-219, March 2009, several efficient and flexible permutator designs for multi-length multi-rate QC-LDPC decoders were presented. However, an efficient implementation of a high-throughput multi-mode LDPC decoder is a challenging task for memory-shared partially-parallel architectures.

The work related to RS-LDPC codes presented in "Power reduction techniques for LDPC decoders" by A. Darabiha on IEEE J. Solid-State Circuits, vol. 43, no. 8, pp. 1835-1845, August 2008 is single-mode. For a single-mode RS-LDPC decoder using a partially-parallel architecture, the shift-structured properties discovered in "Decoder design for RS-based LDPC codes" by J. Sha in IEEE Trans. Circuits. Syst. II, Exp. Briefs, vol. 56, no. 9, pp. 724-728, September 2009 and the MUX-based design adopted in "A 47 Gb/s LDPC decoder with improved low error rate performance" by Z. Zhang in 2009 IEEE VLSI Circuits Symposium, Kyoto, Japan, June 2009 can reduce the permutation complexity remarkability. However, for a multi-mode RS-LDPC decoder architecture, we require an efficient design of configurable permutators, which is one of the most challenging aspects, since the RS-LDPC codes are not QC codes.

SUMMARY OF THE INVENTION

An efficient multi-mode decoder design for high-rate RS-LDPC codes is presented. This multi-mode decoder can be adopted in the various communication applications if flexibility in code rate and correcting capability is required. The structural properties inherent in parity-check matrices can be efficiently used in the design of configurable permutators. A partially-parallel architecture combined with the proposed permutators is used to mitigate the increase in implementation complexity for the multi-mode function. Using this architecture, hardware resources can be efficiently shared among different modes. The variable nodes are partitioned into several groups and each group is processed sequentially in order to overcome the difficulties resultant from the high check-node degrees. Consequently, the critical-path delay can be shortened and, hence, the throughput can be increased.

In order to further increase the throughput, the shuffled MPD can be used to reduce the number of iterations required to achieve a given BER performance. Multi-mode decoders for eight RS-LDPC codes, whose lengths range between 1536 bits and 3968 bits and rates range between 0.79 and 0.93, have been implemented in a 90-nm CMOS process and verified. The proposed decoders can achieve multi-Gbit/s throughput.

The proposed flexible permutator can be further simplified when using the proposed decoder architecture to decode a single LDPC code constructed based on the extended RS code. The proposed length-2048 single-mode decoder can achieve a throughput of 9.7 Gbit/s and operate at a clock frequency of 303 MHz with a core size of 6.31 mm$^2$.

One embodiment according to the invention is a decoder for an LDPC code constructed based on an RS code. The decoder includes a permutation circuit for providing configurable connections defined by a sub-matrix $B(i_0,j_0)$ in a parity check matrix. The parity check matrix is related to a Galois field $GF(p^s)$, wherein p is a prime, s is a positive integer, $i_0$ and $j_0$ are integer indices ranging from 0 to $(p^s-1)$. A set of input includes $p^s$ elements. The permutation circuit includes two permutators and a fixed routing. The first permutator is used for fixing the first element in the set of input and cyclically shifting the other $(p^s-1)$ elements in the set of input by $j_0$ positions, so as to generate a first set of temporary elements. The fixed routing is used for rearranging the first set of temporary elements, so as to generate a second set of temporary elements. The second permutator is used for fixing the first element in the second set of temporary elements and cyclically shifting the remaining $(p^s-1)$ elements of the second set of temporary elements by $i_0$ positions.

The advantage and spirit of the invention may be understood by the following recitations together with the appended drawings.

BRIEF DESCRIPTION OF THE APPENDED DRAWINGS

FIG. 1 shows the $H_{12\times3}'$ matrix for the (3,3)-regular RS-LDPC code constructed based on the shortened RS code.

FIG. 2 shows the $H_{12\times12}$ matrix for a (3,3)-regular RS-LDPC code.

FIG. 5 show the $H_{384\times2048}$ matrix for the (6,32)-regular RS-LDPC code.

FIG. 6 show the $H_{12\times3}'$ matrix for a (3,3)-regular RS-LDPC code constructed based on the extended RS code.

FIG. 9 illustrates the example for showing the difference between $\omega=2$ and $\omega=3$.

FIG. 14 illustrates a detailed decoding procedure.

DETAILED DESCRIPTION OF THE INVENTION

I. Introduction

Figures 3A, 3B, 4A, 4B:
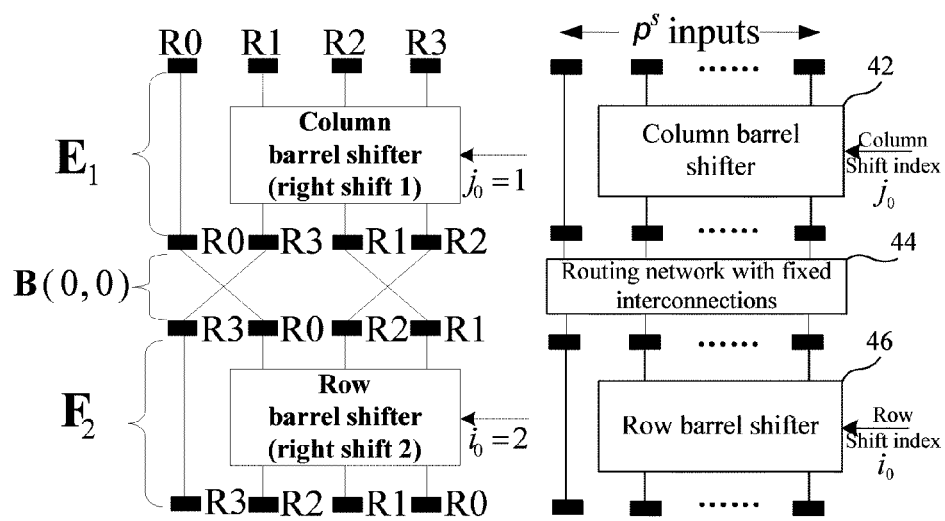
FIG. 3(a) illustrates the procedure of obtaining B(0, 1) from B(0, 0)
FIG. 3(b) illustrates the procedure of obtaining B(2, 1) from B(0, 1).
FIG. 4(a) shows the permutation circuit for the 4×4 B(2, 1) matrix.
FIG. 4(b) shows the permutation circuit for the $p^s \times p^s B(i_0, j_0)$ matrix.

The following description is organized as follows. First, the structural properties of the parity-check matrices are introduced and the permutator architecture for the RS-LDPC codes is proposed. Then, the shuffled MPD and the associated BER results for the RS-LDPC codes are presented. Thereafter, the proposed decoder architecture is presented. The implementation results and comparison of the proposed decoder with other related works are then described.

II. Permutator Architecture for RS-LDPC Codes

A. LDPC Codes Based on Shortened RS Codes

Consider the Galois field $GF(p^s)$, where p is a prime and s is a positive integer. If we let $\alpha$ be a primitive element of $GF(p^s)$, with a positive integer $\rho$, where $2 \leq \rho \leq p^s$, we can construct an RS code over $GF(p^s)$, whose generator polynomial is given by:

$$g(X)=(X+\alpha)(X-\alpha^2)\ldots(X-\alpha^{\rho-2})=g_0+g_1X+g_2X^2+\ldots+X^{\rho-2}, \qquad (1)$$

where $g_i \in GF(p^s)$. The $\rho-1$ coefficients of g(X) are non-zero. If we shorten the RS code by deleting the first $(p^s-\rho-1)$ information symbols, then we obtain a shortened RS code $C_b$ with two information symbols, whose generator matrix is given by:

$$G_b = \begin{bmatrix} g_0 & g_1 & g_2 & \cdots & 1 & 0 \\ 0 & g_0 & g_1 & g_2 & \cdots & 1 \end{bmatrix}.$$

The length of this shortened RS code is $\rho$ code symbols. The nonzero codewords of $C_b$ have two different weights, $\rho$ and $\rho-1$. If we let $r_1$ and $r_2$ denote the first row and the second row of $G_b$, respectively, using $r_1$ and $r_2$ we can construct a subcode $C_b^{(1)}$ of $C_b$, which is given by $$C_b^{(1)} = \{\beta(r_1 + r_2) : \beta \in GF(p^s)\}. \tag{2}$$

Suppose that the weight of $r_1 + r_2$ is $\rho$. Thus, the nonzero codewords of $C_b^{(1)}$ have a weight of $\rho$. Since the weight of $\alpha^{i-2} \in C_b$ is $\rho-1$, $\alpha^{i-2}$ is not in $C_b^{(1)}$ and can be used to construct a coset $C_b^{(i)}$ of $C_b^{(1)}$ according to $$C_b^{(i)} = \{(\alpha^{i-2} r_1 + \beta(r_1 + r_2) : \beta \in GF(p^s)\} \tag{3}$$

for $2 \leq i \leq ps$. There are $p^s$ codewords of $C_b$ in each set $C_b^{(i)}$, $1 \leq i \leq p^s$.

Remember that $0, 1 = \alpha^0, \alpha^1, \ldots, \alpha^{p^s-2}$ form all the elements in $GF(p^s)$. Let $z = (z_\infty, z_0, z_1, \ldots, z_{p^s-2})$ be a binary $p^s$-tuple, whose components correspond to $0, \alpha^0, \alpha^1, \ldots, \alpha^{p^s-2}$. The location vector of $0, \alpha^0, \alpha^1, \ldots \alpha^{p^s-2}$, respectively denoted as $z(0), z(\alpha^0), z(\alpha^1), \ldots, z(\alpha^{p^s-2})$ are given by $z(0) = (1, 0, 0, \ldots, 0)$, $z(\alpha^0) = (0, 1, 0, \ldots, 0)$, $z(\alpha^1) = (0, 0, 1, \ldots, 0), \ldots$, and $z(\alpha^{p^s-2}) = (0, 0, 0, \ldots, 1)$. By letting $c = (c_1, c_2, \ldots c_\rho)$ be a codeword in $C_b$ and replacing each component $c_j$ of c by its location vector $z(c_j)$, where $1 \leq j \leq \rho$, we can obtain a binary weight-$\rho$ $\rho p^s$-tuple $$Z(c) = (z(c_1), z(c_1), \ldots, z(c_\rho)) \tag{4}$$

which is called the symbol location vector of c.

For $1 \leq i \leq p^s$, we form a $p^s \times \rho$ matrix $D_i$ over $GF(p^s)$ whose $p^s$ rows are the $p^s$ different codewords in $C_b^{(i)}$. The codewords $c_{i,j} = 0, 1, \ldots, p^s - 2$, in $C_b^{(1)}$ can be written as $$c_{i,j} = \alpha^j(r_1 + r_2), \tag{5}$$

while the all-zero codeword in $C_b^{(1)}$ is denoted as $c_{1,1}$. For $i = 2, 3, \ldots, p^s$, the codewords $c_{i,j}, j = 0, 1, \ldots, p^s - 2$, in $C_b^{(i)}$ can be written as $$c_{i,j} = \alpha^{i-2} r_1 + \alpha^j(r_1 + r_2), \tag{6}$$

while $c_{i,\infty}$ in $C_b^{(i)}$ can be written as $$c_{i,\infty} = \alpha^{i-2} r_1. \tag{7}$$

Consequently, the $D_i$ matrix can be written as $$D_i = \begin{bmatrix} c_{i,\infty} \\ c_{i,0} \\ c_{i,1} \\ \vdots \\ c_{i,p^s-2} \end{bmatrix}. \tag{8}$$

For $1 \leq i \leq p^s$, we form a binary $p^s \times \rho p^s$ matrix $A_i$ by replacing each codeword (row) $c_{i,j}$ in $D_i$ with its symbol location vector $Z(c_i, 1)$. All columns in $A_i$ have weight 1 and all rows in $A_i$ have weight $\rho$. If we let $\gamma$ be a positive integer, $1 \leq \gamma \leq p^s$, the null space of the $\gamma p^s \times \rho p^s$ matrix $H_\gamma$ $$H_\gamma = \begin{bmatrix} A_1 \\ A_2 \\ \vdots \\ A_\gamma \end{bmatrix} \tag{9}$$

is an RS-LDPC code. Consequently, $H_\gamma$ is a parity-check matrix (PCM) of an (N, K) RS-LDPC code, where $N = \rho p^s$ and K are code length and information (message) length, respectively. Since the PCM is not necessarily full rank, $M \geq N - K$, where $M = \gamma p^s$ is the number of rows in the PCM. The code rate is K/N. The RS-LDPC code is a $(\gamma, \rho)$-regular LDPC code, since each row of $H_\gamma$ has the same row weight $\rho$ and each column of $H\gamma$ has the same column weight $\gamma$. The $H_\gamma$ matrix can be partitioned into $\gamma(\rho)$ block rows (columns) for which each block row (column) includes $p^s$ rows (columns). In addition, the $H_\gamma$ matrix can be divided into $\gamma \rho$ sub-matrices, for which the dimensions of each sub-matrix are $p^s \times p^s$. Each sub-matrix is a permutation matrix, but is not necessarily a circulant matrix.

B. Example for Demonstrating the Structural Properties of RS-LDPC Codes and Proposed Permutator Architecture Consider the Galois field $GF(2^2)$ with a primitive polynomial $1 + X + X^2$. The four elements of this field are $0, 1 = \alpha^0, \alpha$, and $\alpha^2 = 1 + \alpha$. Choosing $\rho = 3$, the generator polynomial of the RS code is $g(X) = \alpha + X$, and the generator matrix of the shortened RS code is $$G_b = \begin{bmatrix} \alpha & 1 & 0 \\ 0 & \alpha & 1 \end{bmatrix}.$$

Consequently, $r_1 = (\alpha 1\ 0)$, $r_2 = (0\ \alpha 1)$, and $r_1 + r_2 = (\alpha \alpha^2\ 1)$. According to (8), we have $$D_1 = \begin{bmatrix} 0 & 0 & 0 \\ \alpha & \alpha^2 & 1 \\ \alpha^2 & 1 & \alpha \\ 1 & \alpha & \alpha^2 \end{bmatrix}, D_2 = \begin{bmatrix} \alpha & 1 & 0 \\ 0 & \alpha & 1 \\ 1 & 0 & \alpha \\ \alpha^2 & \alpha^2 & \alpha^2 \end{bmatrix},$$

and $D_3 = \begin{bmatrix} \alpha^2 & \alpha & 0 \\ 1 & 1 & 1 \\ 0 & \alpha^2 & \alpha \\ \alpha & 0 & \alpha^2 \end{bmatrix}.$ Write $$H'_{12 \times 3} = \begin{bmatrix} D_1 \\ D_2 \\ D_3 \end{bmatrix},$$

which is shown in FIG. 1. After replacing each field element appearing in $H_{12 \times 3}'$ by the associated location vector, where the location vectors for $0, 1, \alpha$, and $\alpha 2$, are respectively given by $z(0) = (1\ 0\ 0\ 0)$, $z(1) = (0\ 1\ 0\ 0)$, $z(\alpha) = (0\ 0\ 1\ 0)$, and $z(\alpha 2) = (0\ 0\ 0\ 1)$, we can obtain a matrix $H_{12 \times 12}$ as shown in FIG. 2.

The null space of $H_{12 \times 12}$ is a (3,3)-regular LDPC code with a length of 12 bits and a rate of ⅓. The i-th block row of $H_{12\times 12}$ is the $A_i$, i=1, 2, 3, where each block row includes 4 rows. We can divide the $H_{12\times 12}$ matrix into 9 sub-matrices for which the dimensions of each sub-matrix are 4×4. Since not all 4×4 sub-matrices of $H_{12\times 12}$ are circulant matrices, the RS-LDPC code is not a quasi-cyclic code. Consequently, efficient permutator designs proposed in conventional decoders for QC-LDPC codes cannot be directly used for the RS-LDPC codes.

As shown in FIG. 2, we can classify all the 4×4 sub-matrices of $H_{12\times 12}$ into three types. Type-I sub-matrices are obtained by deleting the last sub-matrix of $A_1$. Remember that $A_1$ is obtained from the symbol location vectors of codewords in cp. Since the first row of $A_1$ is the symbol location vector of the zero codeword, the first row of each Type-I sub-matrix must be [1 0 0 0]. In addition, since the weight of each non-zero codeword in $C_b^{(i)}$ is $\rho$, which equals 3 in this example, there is no zero field element in the first block row of $H_{2\times 3}'$ except for the first row. Consequently, the first column of each Type-I sub-matrix must be $[1\ 0\ 0\ 0]^T$, where T denotes the matrix transpose. Moreover, if we ignore the first row and the first column of a Type-I sub-matrix, the remaining 3×3 sub-matrix is a weight-1 circulant matrix. This is due to the fact that $c_{1,j+1}=\alpha c_{1,j}$, for j=0,1. To realize the permutation defined by a Type-I sub-matrix, we can use a barrel shifter plus one fixed interconnection.

Since the last elements of $r_1$ and $r_1+r_2$ are 0 and 1, respectively, the last column of each block row of $H_{12\times 3}'$ must be $[0\ 1\ \alpha\ \alpha^2]^T$ and hence all Type-II sub-matrices are the 4×4 identity matrix, as shown in FIG. 2.

It can be seen that each sub-matrix in FIG. 1 corresponding to a Type-III sub-matrix in FIG. 2 can be written as $$b(i_0, j_0) = \begin{bmatrix} \alpha^{i_0} \\ \alpha^{i_0}(1+\alpha^{j_0}) \\ \alpha^{i_0}(1+\alpha^{j_0+1}) \\ \alpha^{i_0}(1+\alpha^{j_0+2}) \end{bmatrix}, \quad (10)$$

where $i_0$ and $j_0$ are two integers which are determined from the corresponding coset leader. By substituting each element in the $b(i_0, j_0)$ matrix with its corresponding location vector, we can obtain a Type-III sub-matrix $B(i_0, j_0)$. For example, the Type-III part in FIG. 2 can be written as $$\begin{bmatrix} B(1, 0) & B(0, 2) \\ B(2, 2) & B(1, 1) \end{bmatrix}. \quad (11)$$

From (11), it can be seen that the $i_0$ values associated with the (l+1)-th block row of the PCM can be obtained by increasing each corresponding $i_0$ value associated with the l-th block row by 1. Similarly, the $j_0$ values associated with the (l+1)-th block row of the PCM can be obtained by decreasing each corresponding $j_0$ value associated with the l-th block row by 1. These properties can be used to reduce the storage complexity for storing these shift indices.

As shown in FIG. 3(a), we can obtain the B(0, 1) matrix from B(0, 0), which is called the base matrix, by first fixing the first row of the base matrix and then cyclically shifting the remaining columns upward by 1 ($j_0$) position. If we let $E_{j_0}$ be a matrix which is obtained by first fixing the first row of the 4×4 identity matrix and then cyclically shifting the remaining columns upward by $j_0$ position(s), then we have $$B(0, 1) = E_1 B(0, 0) = \begin{bmatrix} 1 & 0 & 0 & 0 \\ 0 & 0 & 1 & 0 \\ 0 & 0 & 0 & 1 \\ 0 & 1 & 0 & 1 \end{bmatrix} B(0, 0). \quad (12)$$

As shown in FIG. 3(b), we can obtain the B(2, 1) matrix from B(0, 1) by first fixing the first column of B(0, 1) and then cyclically shifting the remaining rows right by 2 ($i_0$) positions. If we let $F_{i_0}$ be a matrix which is obtained by first fixing the first column of the 4×4 identity matrix and then cyclically shifting the remaining rows right by $i_0$ positions, then we have $$B(2, 1) = B(0, 1)F_2 = B(0, 1)\begin{bmatrix} 1 & 0 & 0 & 0 \\ 0 & 0 & 0 & 1 \\ 0 & 1 & 0 & 0 \\ 0 & 0 & 1 & 0 \end{bmatrix}. \quad (13)$$

From (12) and (13), we have $B(2, 1)=E_1 B(0, 0)F_2$. Similar to a Type-I sub-matrix, we can use a barrel shifter plus one fixed interconnection to realize the permutation defined by $E_1$ ($F_2$). FIG. 4(a) shows the proposed architecture for the permutation defined by the B(2, 1) matrix, where we use a routing network with fixed interconnections to realize the permutation defined by the base matrix. Similarly, we can obtain $B(i_0, j_0)=E_{j_0}B(0, 0)F_{i_0}$ and the associated architecture for the permutation defined by the $B(i_0, j_0)$ matrix, which is shown in FIG. 4(b).

C. RS-LDPC Codes Supported by Multi-Mode Decoders

Multi-mode decoders according to the invention can support several RS-LDPC codes constructed using the Galois field $GF(2^6)$ with a primitive polynomial $1+X+X^6$. In the following, we use a (6, 32)-regular RS-LDPC code to illustrate the construction procedure. The generator matrix of the shortened RS code is $$G_b = \begin{bmatrix} \alpha^{24} & \alpha^{34} & \alpha^{53} & \cdots & 1 & 0 \\ 0 & \alpha^{24} & \alpha^{34} & \alpha^{53} & \cdots & 1 \end{bmatrix}.$$

Then, we can obtain a matrix $H_{384\times 32}'$ for which each row of $H_{384\times 32}'$ is a codeword of the shortened RS code and the i-th block row of $H_{384\times 32}'$ includes all the codewords in cr. After replacing each field element appearing $H_{384\times 32}'$ with the associated location vector, we can obtain the PCM $H_{384\times 2048}$ of this (6, 32)-regular RS-LDPC code. FIG. 5 shows the $H_{384\times 2048}$ matrix, where each dot represents a 1 in m the matrix. This matrix can be divided into $\gamma\cdot\rho(=6\cdot 32=192)$ sub-matrices, where the dimensions of each sub-matrix are $p^s \times p^s (=64\times 64)$. Similar to FIG. 2, the 192 sub-matrices of the $H_{384\times 2048}$ matrix can be classified into three types. The first 31 sub-matrices in the first block row are classified as Type I, where a block row includes 64 rows. For a Type-I sub-matrix, if we ignore the first row and the first column, then the resultant 63×63 matrix is a weight-1 circulant matrix. To implement the permutation defined by a Type-I sub-matrix, we can use a barrel shifter plus one fixed interconnection. All the $\gamma(=6)$ sub-matrices in the last block column are the 64×64 identity matrix and are classified as Type II. The remaining 155 sub-matrices are classified as Type III. A Type-III matrix can be constructed based on a 64×64 base matrix B(0, 0) for which the initial row is the location vector of 1 and the i-th row is the location vector of $1+\alpha^{i-1}$, i=1, 2, . . . , 63. A Type-III sub-matrix $B(i_0, j_0)$ can be obtained as follows. First, by fixing the first row of the base matrix, we cyclically shift the remaining columns upward by $j_0$ positions to obtain a temporary matrix. Then, by fixing the first column of the temporary matrix, we cyclically shift the remaining rows right by $i_0$ positions. We can use the architecture shown in FIG. 4(b) to realize the permutation defined by the $B(i_0, j_0)$ matrix, where the routing network with fixed interconnections realizes the permutation defined by the 64×64 base matrix.

Since the rank of $H_{384\times 2048}$ is 325, it is a PCM of a (6, 32)-regular LDPC code whose rate is $1723/2048\approx 0.84$. Moreover, other seven RS-LDPC codes whose rates range between 0.79 and 0.93 and lengths range between 1536 bits and 3968 bits were chosen for hardware implementation. The associated parameters are shown in Table I. The PCM of each of these codes can be divided into $\gamma\cdot\rho$ sub-matrices, where the dimensions of each sub-matrix are $p^s\times p^s$ $(=64\times 64)$. Similar to the $H_{384\times 2048}$ matrix, the sub-matrices of each of these parity-check matrices can be classified as Types I, II, and M. Since all these codes are constructed based on $GF(2^6)$, the same permutators can be used for different codes if appropriate shift indices for barrel shifters are adopted.

D. RS-LDPC Codes Constructed Based on Extended RS Codes

RS-LDPC codes can also be constructed based on the extended $(p^3, 2)$ RS code over $GF(p^s)$. Following the procedure given in Section II.A, we can obtain the $D_i$ matrix, $1\leq i\leq p^s$, and the $H_\gamma$ matrix through $r1=(1\ 1\ \ldots\ 1\ 1\ 0)$ and $r_1+r_2=(1\ \alpha^{p^s-2}\ \ldots\ \alpha^2\ \alpha\ 1)$, where the dimensions of $D_i$ and $H_\gamma$ are $p^s\times p^s$ and $\gamma p^s\times p^{2s}$, respectively. We can obtain a PCM of a length-$\rho p^s$ RS-LDPC code by selecting p block columns from the $H_\gamma$ matrix either continuously or discontinuously. For example, the (2048, 1723) RS-LDPC code adopted in the IEEE 802.3an standard is constructed based on the (64, 2) extended RS code through discontinuous column selection. The PCM of this kind of RS-LDPC codes can also be divided into $\gamma\rho$ sub-matrices for which the dimensions of each sub-matrix are $p^s\times p^s$. As RS-LDPC codes constructed based on shortened RS codes, these sub-matrices can also be classified as Types I, II, and III. The flexible permutator architecture presented in Section II.B can also be applied to RS-LDPC codes constructed based on extended RS codes.

For example, we consider RS-LDPC codes constructed based on the Galois field $GF(2^2)$ with a primitive polynomial $1+X+X^2$. Choosing $\gamma=3$, we have $r_1=(1\ 1\ 1\ 0)$ and $r_1+r_2=(1\ \alpha^2\ \alpha\ 1)$. According to (8), we have $$D_1 = \begin{bmatrix} 0 & 0 & 0 & 0 \\ 1 & \alpha^2 & \alpha & 1 \\ \alpha & 1 & \alpha^2 & \alpha \\ \alpha^2 & \alpha & 1 & \alpha^2 \end{bmatrix},$$

$$D_2 = \begin{bmatrix} \alpha^0 & \alpha^0 & \alpha^0 & 0 \\ 1+\alpha^0 & \alpha^2+\alpha^0 & \alpha+\alpha^0 & 1 \\ \alpha+\alpha^0 & 1+\alpha^0 & \alpha^2+\alpha^0 & \alpha \\ \alpha^2+\alpha^0 & \alpha+\alpha^0 & 1+\alpha^0 & \alpha^2 \end{bmatrix},$$

and $D_3 = \begin{bmatrix} \alpha^1 & \alpha^1 & \alpha^1 & 0 \\ 1+\alpha^1 & \alpha^2+\alpha^1 & \alpha+\alpha^1 & 1 \\ \alpha+\alpha^1 & 1+\alpha^1 & \alpha^2+\alpha^1 & \alpha \\ \alpha^2+\alpha^1 & \alpha+\alpha^1 & 1+\alpha^1 & \alpha^2 \end{bmatrix}.$ Write $$H'_{12\times 4} = \begin{bmatrix} D_1 \\ D_2 \\ D_3 \end{bmatrix}.$$

Choosing the first, the third, and fourth columns of matrix $H_{12\times 4}'$, we can obtain a matrix denoted as $H_{12\times 3}'$, which is shown in FIG. 6. After replacing each field element appearing in $H_{12\times 3}'$ by the associated location vector, we can obtain a matrix $H_{12\times 12}$. The Type-III part in $H_{12\times 12}$ can be written as $$\begin{bmatrix} B(0,0) & B(0,1) \\ B(1,2) & B(1,0) \end{bmatrix}. \tag{14}$$

Note that the Type-III sub-matrices belonging to the same block row of the PCM have the same the row shift indices $i_0$. In "Decoder design for RS-based LDPC codes" reported by J. Sha in IEEE Trans. Circuits. Syst. II, Exp. Briefs, vol. 56, no. 9, pp. 724-728, September 2009, it was revealed that except for the first row and the last column of the $D_i$ matrix, the remaining $(p^s-1)\times(p^s-1)$ matrix is a circulant matrix for $1\leq i\leq p^s$. In this prior art, the authors applied this shift property to RS-LDPC codes constructed based on extended RS codes using continuous column selection in order to reduce the permutator complexity. However, for RS-LDPC codes constructed based on shortened RS codes, this property does not exist. For example, the RS-LDPC code given in Section MB does not have the cyclic property in the resultant matrix obtained by deleting the first row and the last column of the $D_2$ (or $D_3$) matrix. For RS-LDPC codes constructed based on extended RS codes using discontinuous column selection, this shift property does not exist as can be seen from the $H_{12\times 3}'$ matrix given in FIG. 6.

III. RS-LDPC Codes Using Shuffled MPD

The PCM of an LDPC code can be represented by a bipartite graph or a Tanner graph. If a 1 appears in the (i, j) entry of H, there is an edge connecting the i-th check node and the j-th variable node in the Tanner graph. Message-passing decoding (MPD) can be performed through this graph. Both the sum-product algorithm (SPA) and the min-sum algorithm (MSA) can be used in the operations of check and variable nodes. In "Shuffled iterative decoding" reported by J. Mang in IEEE Trans. Commun, vol. 53, no. 6, pp. 209-213, February 2005, both bit-wise and group-based shuffled MPD using SPA were proposed. A generic hardware architecture for an SPA-based shuffled MPD was presented in "Generic description and synthesis of LDPC decoders" reported by F. Guilloud in IEEE Trans. Commun., vol. 55, no. 11, pp. 2084-2091, November 2007. In "Efficient decoder design for high-throughput LDPC decoding" reported by Z. Cui in Proc. IEEE Asia Pacific Conf. on Circuits and Syst., pp. 1640-1643, December 2008, the authors proposed a shuffled MPD using a modified MSA with reduced complexity. In the following, we describe the group-based shuffled MPD, where the variable nodes (or equivalently columns of the PCM) are divided into G groups for which the size of each group is $N_G$ variable nodes (columns).

A. Proposed Shuffled MPD

For each variable node j, the variable-to-check (V2C) message associated with check node i, which is produced at the k-th iteration, is denoted as $Q_{ji}[k]$. Similarly, for each check node i, the check-to-variable (C2V) message associated with variable node j, which is produced at the k-th iteration, is denoted as $R_{ij}[k]$. At the k-th iteration, the operations performed at the variable and check nodes for group g are described as follows:

Variable-node (VN) operations for group g: For every variable node j in group g, i.e., $g \cdot N_G \leq j < (g+1) \cdot N_G$, compute $Q_{ji}[k]$ values corresponding to each of its check node neighbors i according to $$Q_{ji}[k] = \lambda_j + \sum_{i' \in I_C[j] \setminus \{i\}} R_{i'j}[k-1] \qquad (15)$$

where $\lambda_j$ is the channel (reliability) value of variable node j and $I_C[j]$ denotes the set of check nodes connected to the variable node j.

Check-node (CN) operations for group g: For every check node i associated with the variable nodes j in group g, i.e., $i \in I_C[j]$, $g \cdot N_G \leq j < (g+1) \cdot N_G$, compute $R_{ij}[k]$ values according to $$R_{ij}[k] = S_{ij}[k] \times \max\{(|R'_{ji}[k]| - \delta), 0\}, \qquad (16)$$

$$|R'_{ji}[k]| = \min\left\{ \min_{\substack{j' \in I_R[i] \setminus j \\ j' < (g+1) \cdot N_G}} |Q_{j'i}[k]|, \min_{\substack{j' \in I_R[i] \setminus j \\ j' \geq (g+1) \cdot N_G}} |Q_{j'i}[k-1]| \right\}, \qquad (17)$$

and $$S_{ij}[k] = \prod_{\substack{j' \in I_R[i] \setminus j \\ j' < (g+1) \cdot N_G}} \mathrm{Sgn}(Q_{j'i}[k]) \times \prod_{\substack{j' \in I_R[i] \setminus j \\ j' \geq (g+1) \cdot N_G}} \mathrm{Sgn}(Q_{j'i}[k-1]) \qquad (18)$$

where $\delta$ is an offset constant and $I_R[i]$ denotes the set of variable nodes (bit nodes) connected to the check node i.

Figure 7:
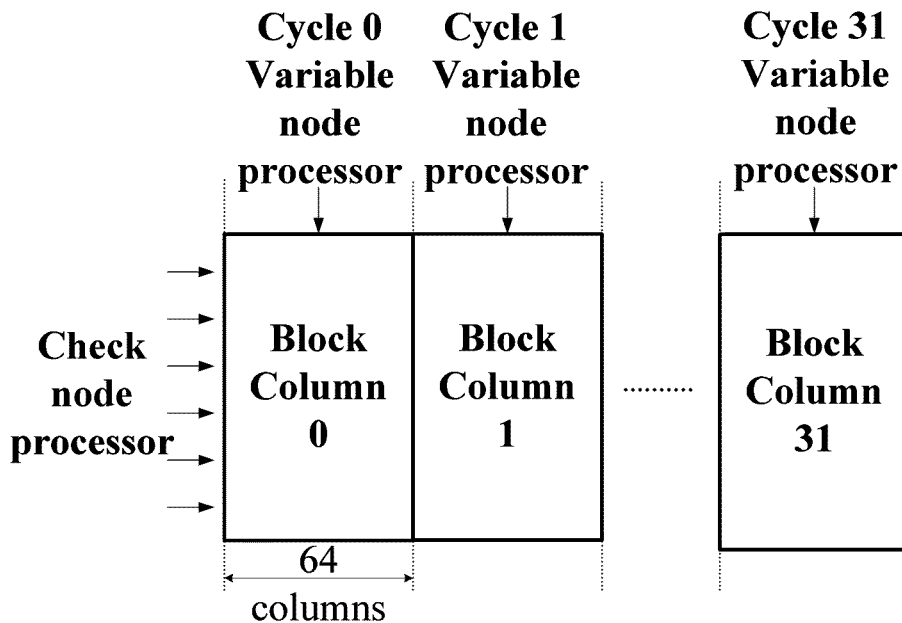
FIG. 7 illustrates the processing sequence for the (6,32)-regular RS-LDPC code using $N_G=64$.

CN and VN operations for group 0, group 1, ..., group G-1, are performed sequentially to complete one iteration. FIG. 7 shows the processing order for the (6, 32)-regular LDPC code, where one group includes the columns in one block column, i.e., $N_G=64$. In the last iteration, i.e., $k=N_{it}$, a hard decision for each variable node j is made based on the sign of a posterior probability (APP) $\Lambda_j[N_{ij}]$ of variable node j, which is given by $$\Lambda_j[N_{it}] = \lambda_j + \sum_{i' \in I_C[j]} R_{i'j}[N_{it} - 1]. \qquad (19)$$

It can be seen from (17) that many comparisons are needed in order to obtain one value of $|R_{ij}'[k]|$. Consequently, the complexity of performing CN operations for LDPC codes with large row weights such as the high-rate codes given in Table I is high. To reduce the complexity of the comparison, we can store an ordered set of $|Q_{ji}|$, $j \in I_R[i]$, for each row i. Let $\{|Q_{j_0 i}|, |Q_{j_1 i}|, \ldots, |Q_{j_{|I_R[i]|-1} i}|\}$ be such an ordered set, where $|Q_{j_0 i}| \leq |Q_{j_1 i}| \leq \ldots \leq |Q_{j_{|I_R[i]|-1} i}|$.

In addition, we also store the associated indices $j_k$, $k=0, 1, \ldots, I_R[i]-1$. Note that the values of $|Q_{ji}|$ are produced during either the current or the previous iteration. With such an ordered set, updating $|R_{ij}'|$ is quite easy, since we only need to read $|Q_{j_0}^i|$, $|Q_{j_1}^i|$, and $j_0$ to update $|R_{ij}'|$.

If $j=j_0$, $|R_{ij}'|=|Q_{j_1 i}|$. If $j \neq j_0$, $|R_{ij}'|=|Q_{j_0 i}|$.

In order to calculate $S_{ij}$ correctly, we need to store the sign bit of each $Q_{ji}$ value. In addition, we store $$S_{T,i} = \prod_{k=0}^{|I_R[i]|-1} \mathrm{sgn}(Q_{j_k i})$$

to reduce the complexity in calculating $S_{ij}$. With $S_{ij}$ and $|R_{ij}'|$, we can calculate $R_{ij}$ according to (16). Hence, we do not need to store $R_{ij}$ values.

We can reduce the storage space and comparison complexity by only storing the first $\omega$ values of the ordered set, i.e.

$|Q_{j_0 i}|, |Q_{j_1 i}|, \ldots, |Q_{j_{\omega-1} i}|$, since large values of $|Q_{ji}|$ contribute little in the calculation of $|R_{ij}'|$. This ordered set is denoted as $\Phi_{i,\omega}$, which is initialized with a large constant $L_M$. The associated index set $\{j_0, j_1, \ldots, j_{\omega-1}\}$ is denoted as $J_{i,\omega}$. Initially, $J_{i,\omega}=\phi$, where $\phi$ is the null set. The detailed decoding procedure is described in FIG. 14. After the first iteration, the contents in $\Phi_{i,\omega}$ are the absolute values of $\omega$ most unreliable channel values associated with row i. Then we calculate $R_{ij}$ values associated with the same group of columns at the CN-R stage (i.e. the stage for selecting R values in the check node processor). Following that, $Q_{ji}$ values belonging to the same group of columns are generated at the VN stage. Finally, the contents of the ordered set $\Phi_{i,\omega}$ and the index set $J_{i,\omega}$ are updated at the CN-S stage (i.e. the stage of sorting in the check node processor). The CN operations, specified by (16), (17), and (18), are performed in the CN-R and CN-S stages.

B. BER Results

From the description given in Section II.A, it can be seen that the value of w determines the complexity of sorting (or comparison), memory access, and storage. Consequently, a small value of $\omega$ is desired. For example, the $\omega$ value adopted in "Efficient decoder design for high-throughput LDPC decoding" reported by Z. Cui in Proc. IEEE Asia Pacific Conf. on Circuits and Syst., pp. 1640-1643, December 2008 is 2. However, it can be seen from FIG. 8 that the shuffled MPD using $\omega=2$ results in noticeable degradation in BER performance compared to using $\omega=3$. The reason is described as follows. It can be seen from (17) that the $|R_{ij}'[k]|$ value depends on $|I_R[i]|$ V2C values. In addition, the contents of the ordered set are continuously updated as the decoding progresses group by group. Consequently, the contents of the ordered set are not the same even within the same iteration. Although we only need to read the first two minimum values of the ordered set, i.e., $|Q_{j_0 i}|$ and $|Q_{j_1 i}|$ values, to calculate $|R_{ij}'|$ as the TPMP using MSA, these two minimum values are likely to be changed even within the same iteration in the proposed shuffled MPD. In other words, calculating $|R_{ip}'[k]|$ and $|R_{iq}'[k]|$ values, where variable nodes p and q belong to two distinct groups, are likely based on distinct values of $|Q_{j_0 i}|$ and $|Q_{ji}|$. This is the remarkable difference between the proposed shuffled MPD and the TPMP.

Now we show that using different ω values will result in different C2V values through an example. Consider check node i which connects to variable nodes 1, 2, and 3. Suppose that at the end of the (k−1)-th iteration, $\Phi_{i,3}=\{0.1, 0.2, 0.3\}$ and $J_{i,3}=\{1, 2, 3\}$ as shown in FIG. 9(*a*). Note that these two sets are ordered. In addition, suppose that group 1 involves only variable node 1 and group 2 involves only variable node 2. Following Algorithm 1, we can obtain $R_{i,1}[k−1]=0.2$ at the CN-R stage of the k-th iteration for group 1. Suppose that the magnitude of the V2C message obtained at the VN stage for variable node 1 is 0.4, i.e, $|Q_{1,i}[k]|=0.4$. Then, at the CN-S stage, $\Phi_{i,3}$ and $J_{i,3}$ become $\{0.2, 0.3, 0.4\}$ and $\{2, 3, 1\}$, respectively. At the CN-R stage of the k-th iteration for group 2, we can obtain $R_{i,2}[k−1]=0.3$. This procedure is also shown in FIG. 9(*a*). The case of ω=2 is shown in FIG. 9(*b*). For the case of ω=2, we obtain $R_{i,2}[k−1]=0.4$ which is different that obtained by using ω=3. Consequently, using ω=2 will result in different BER performance compared to using ω=3.

Figure 8:
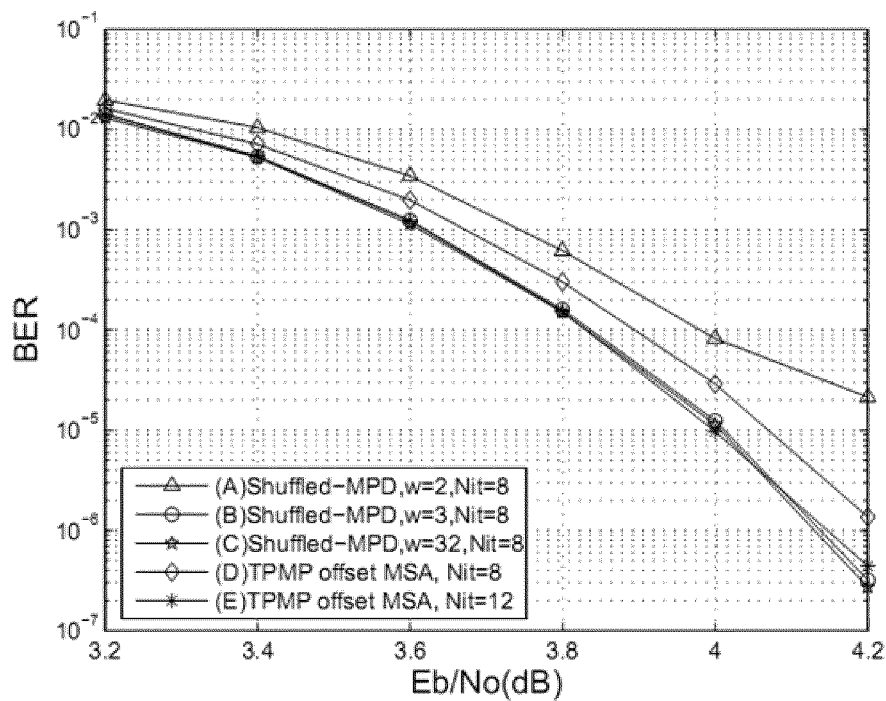
FIG. 8 shows the BER of the (6, 32)-regular length-2048 RS-LDPC code in the additive white Gaussian noise channel using various decoding algorithms (for shuffled MPD, $N_G=p^s=64$ and $G=\rho=32$ are used.)

It can also be seen that using ω=3 achieves almost the same BER performance compared to using $\omega=|I_R[i]|=\rho=32$. Consequently, a good tradeoff between complexity and performance is to use ω=3, or limit the range of ω between 3 and $(|I_R[i]|-1)$. Also included in FIG. 8 are the BER results of using TPMP together with offset MSA. The shuffled MPD using ω=3 converges faster compared to the TPMP decoding. Also included in Table I are the BER results of the eight RS-LDPC codes using the proposed shuffled MPD with $N_G=64$, $N_{it}=8$, and ω=3.

IV. Decoder Architectures for High-Rate RS-LPDC Codes Using Shuffled MPD

In this section, we present vertically-scheduled decoder architectures using the proposed permutators for high-rate RS-LPDC codes. Both multi-mode and single-mode decoders are presented. The multi-mode decoder can support the RS-LDPC codes given in Table I which are constructed based on the shortened RS codes. Since the RS-LDPC code adopted in the IEEE 802.3an standard, is constructed based on the extended RS code, the proposed single-mode decoder is designed for this kind of RS-LDPC codes.

A. Decoder Architecture for a (γ, ρ)-Regular RS-LDPC Code

Figure 10:
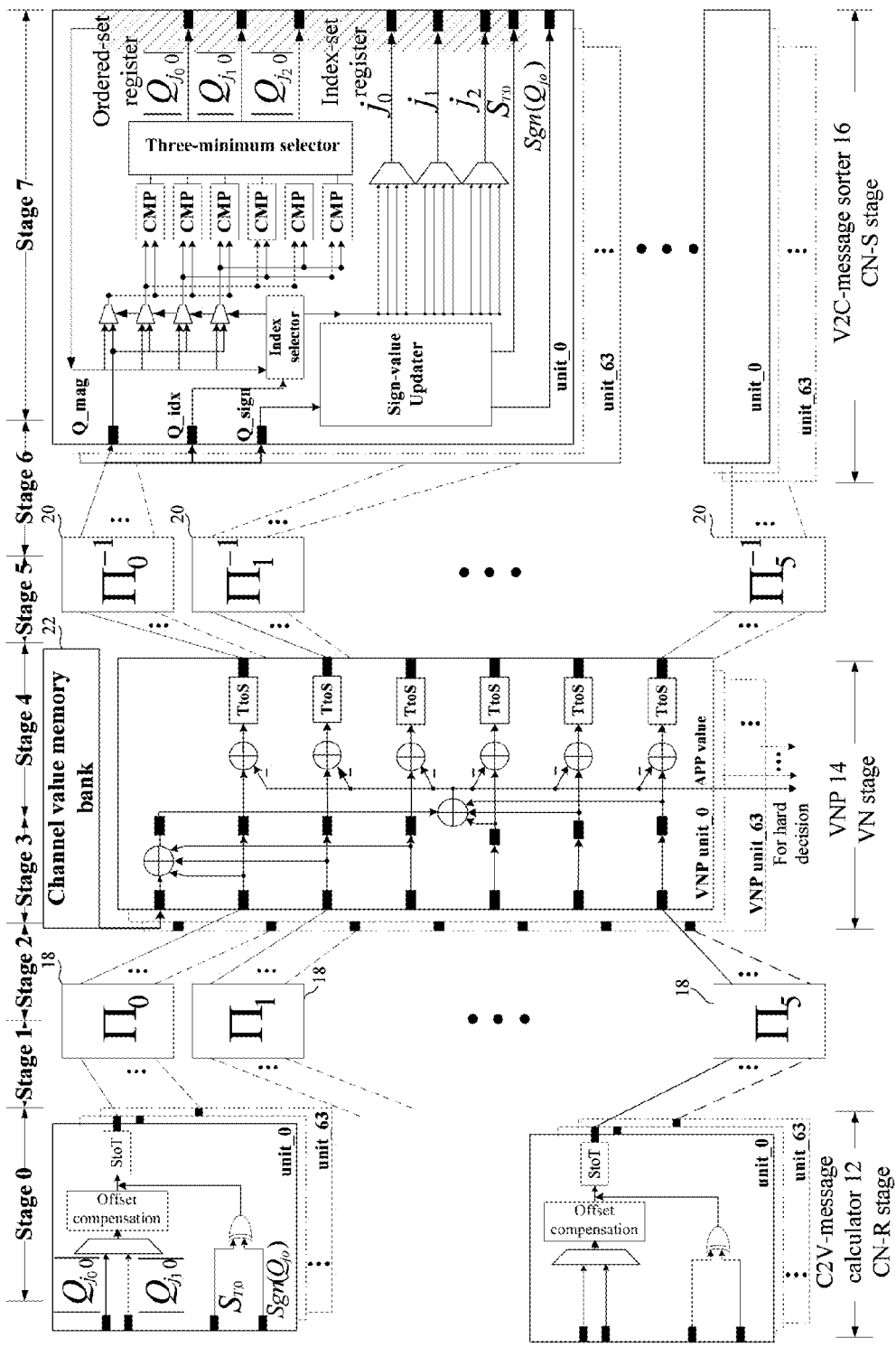
FIG. 10 shows the proposed decoder architecture using $N_G=64$ for a $(\gamma, \rho)$-regular RS-LDPC code constructed based on $GF(2^6)$ and $\gamma=6$.

FIG. 10 shows the proposed decoder architecture using $N_G=64$ for a (γ, ρ)-regular RS-LDPC code constructed based on GF($2^6$) and γ=6, where the CN-R stage, VN stage, and CN-S stage shown in Algorithm 1 are performed in the C2V-message calculator, variable-node processor (VNP), and V2C-message sorter, respectively. γ permutators $\Pi_0$, $\Pi_1$, ..., $\Pi_{\gamma-1}$ are inserted between the C2V-message calculator and the VNP. Similarly, γ inverse permutators $$\prod_0^{-1}, \prod_1^{-1}, \ldots, \prod_{\gamma-1}^{-1}$$

are inserted between the VNP and the V2C-message sorter. The input size of each (inverse) permutator is $p^s=64$. The C2V-message calculator includes γ modules for which each module is responsible for the calculation of the C2V messages $R_{ij}$ associated with one block row of the PCM of the RS-LDPC code. These γ modules operate in parallel. Each module is followed by a size-$p^s$ permutator. The VNP includes $N_G$ variable-node processing units, which can process a group of $N_G$ columns (or variable nodes) in parallel. After the inverse permutation, the ordered set $\Phi_{i,\omega}$ and its associated index set $J_{i,\omega}$ will be updated using the latest $|Q_{ji}|$ values. The ordered-set registers and index-set registers in the V2C-message sorter are used to store the contents in the ordered sets and the index sets, respectively. In the V2C-message sorter, a sign-bit memory and total-sign registers, which are not shown in FIG. 10, are used to store the sign bits of $Q_{ji}$ values and $S_{T,i}$ values, respectively.

In FIG. 10, the blocks labeled as StoT represent sign-magnitude to two's complement transformers. The blocks labeled as TtoS represent two's complement to sign-magnitude transformers. The blocks labeled as CMP represent comparators.

In the decoder shown in FIG. 10, the decoding parallelism is 64, i.e., $N_G=64$, since 64 VNUs are operated in parallel. To double the decoding throughput, we can double the processing units in the VNP such that the VNP can process 128 columns (or the equivalent of two block columns) in parallel, i.e., $N_G=128$. To meet the double-throughput requirement, the number of permutators and inverse permutators should also be doubled and the number of processing units in the C2V-message calculator and the V2C-message sorter should be increased accordingly. For the proposed architecture, the throughput TP in code bits can be calculated according to $$TP \approx \frac{f_{clk} \cdot N}{G \cdot N_{it}} = \frac{f_{clk} \cdot N_G}{N_{it}}, \tag{20}$$

where $N=N_G\cdot G$ and $f_{clk}$ is the operating frequency. According to (20), the TP values for RS-LDPC codes are independent of code length. In addition, the TP value can be increased by increasing $N_G$ value or decreasing $N_{it}$ value. Finally, in order to achieve a high throughput by shortening the critical-path delay, a pipeline architecture can be used.

B. Multi-Mode Functionality

It can be seen that the decoder architecture given in FIG. 10 can be used as a multi-mode decoder if flexible size-$p^s$ permutators $\Pi_i$ and flexible size-$p^s$ inverse permutators $\Pi_i^{-1}$ are used for i=0, 1, ..., 5. As discussed in Section II, the γρ sub-matrices in the PCM of the (γ, ρ)-regular RS-LDPC code can be classified as Types I, II, and III. The permutator $\Pi_0$ and inverse permutator $\Pi_0^{-1}$ perform the permutations defined by the Type-I and Type-II sub-matrices. We can use one multi-stage barrel shifter plus one fixed interconnection to implement $\Pi_0$ ($\Pi_0^{-1}$). The permutators $\Pi_i$, i=1, 2, ..., 5, and inverse permutators $\Pi_i^1$, i=1, 2, ..., 5, perform the permutations defined by the Type-II and Type-111 sub-matrices. Using the architecture shown in FIG. 4(*b*), we need two multi-stage barrel shifters for each of $\Pi_i$ and $\Pi_i^{-1}$, i=1, 2, ..., 5. In addition, we need $\log_2 p^s=6$ bits to control each barrel shifter. Consequently, 22 barrel shifters with a total of 22·6=132 control bits are used in the proposed decoder shown in FIG. 10.

It is known that the Benes network is an efficient approach to realize arbitrary permutations. Consequently, we compare the proposed permutator design with the Benes network. A Benes network includes $p^s/2\times(2 \log_2 p^s-1)$ switches, where the size of each is 2×2. A one-bit signal is needed to control each 2×2 switch. Consequently, a total of $p^s/2\times(2 \log_2 p^s-1)$ control bits must be computed. We now investigate the complexity of using these two flexible permutator designs in the proposed multi-mode decoder based on a word length of 5 bits. For the design based on the Benes network, 420K gates and 4224 control bits are required. For the proposed design, 150K gates and 132 control bits are needed. Consequently, the proposed permutator is an efficient design for the proposed multi-mode decoder architecture.

Compared to the (6, 32)-regular length-2048 RS-LDPC code given in Table I, the overheads for supporting the other seven RS-LDPC codes given in Table I are described as follows. We need to increase the storage space such that the requirements for the (3968, 3643) code with $\rho=62$ and $\gamma=6$ can be met. Since these eight RS-LDPC codes are constructed based on the shortened RS codes using the same field $GF(2^6)$, the proposed permutator design can be used if proper shift indices for the row and column barrel shifters are provided. Consequently, in order to support the other seven codes, additional shift index assignments to the barrel shifters are needed. Using this multi-mode decoder to decode a code with $\gamma=5$, some circuits in the VNUs and CNUs are bypassed and hence additional multiplexers are used to bypass these circuits. Complexity comparison for supporting one code and eight codes using $N_G=64$ is given in Table II. It can be seen that the hardware resources can be efficiently shared among different modes.

C. Architecture for a Single-Mode (2048, 1723) Decoder

As described in Section II.D, the (6, 32)-regular (2048, 1723) RS-LDPC code adopted in the IEEE 802.3an standard is constructed based on the (64, 2) extended RS code through discontinuous column selection. We now consider to use the architecture shown in FIG. 10 to implement a single-mode decoder for this kind of RS-LDPC codes when $N_G=64$. Since the row shift indices $i_0$ of Type-III sub-matrices belonging to the same block row are the same for this kind of RS-LDPC codes, the permutation defined by the B(0, 0) and $F_{i0}$ matrices can be integrated and implemented through one routing network with fixed interconnections when the architecture shown in FIG. 10 is used to implement the single-mode decoder. Consequently, each permutator $\Pi_i$ and each inverse permutator $\Pi_i^{-1}$ in FIG. 10 can be implemented by using one barrel shifter plus one routing network with fixed interconnections. Consequently, 12 barrel shifters with a total of $12 \cdot 6=72$ control bits are used in the single-mode decoder. In addition, the routing networks with fixed interconnections for different permutators are in general different. Note that for RS-LDPC codes constructed based on shorten RS codes, the permutation defined by the $F_{i0}$ matrix can not be fixed and can be implemented through a barrel shifter, since the row shift indices $i_0$ of Type-III sub-matrices belonging to the same block row of the PCM are not the same even though a single code is supported.

Since the MUX-based permutator design is very efficient for the horizontally-scheduled decoder architecture presented in "A 47 Gb/s LDPC decoder with improved low error rate performance" reported by Z. Zhang on 2009 IEEE VLSI Circuits Symposium, Kyoto, Japan, June 2009, we now consider to use a MUX-based design in the vertically-scheduled decoder shown in FIG. 10. For a MUX-based decoder using $N_G=64$, we can use 64 32-to-1 multiplexers and 64 1-to-32 de-multiplexers to implement the permutator $\Pi_i$ and inverse permutator $\Pi_i^{-1}$, respectively, for $i=0, 1, \ldots, 5$. We need $64 \cdot 5=320$ control bits for each permutator $\Pi_i$ (or inverse permutator). The complexity of using the proposed permutator design and the MUX-based design in the proposed single-mode decoder is given in Table III, where both $N_G=64$ and $N_G=256$ are considered. From this table, we can see that the proposed permutator is more suitable for the proposed vertically-scheduled single-mode decoder compared to the MUX-based design.

D. Comparison with a TPMP-Based Decoder Using Vertical Scheduling

In "Decoder design for RS-based LDPC codes" reported by J. Sha on IEEE Trans. Circuits. Syst. II, Exp. Briefs, vol. 56, no. 9, pp. 724-728, September 2009 (hereinafter referred as Sha), the authors proposed a vertically-scheduled decoder for a (2048, 1723) RS-LDPC code based on the TPMP. The proposed shuffled iterative decoder can increase the convergence speed in BER performance compared to the TPMP-based decoder presented in Sha, although both decoders use vertical scheduling. Since the RS-LDPC code adopted in Sha is constructed based on the (64, 2) extended RS code using continuous column selection, the complexity of permutation networks can be minimized by utilizing the cyclic shift property inherent in this kind of RS-LDPC codes. Consequently, the decoder can achieve low complexity with promising throughput which can be observed from the synthesis results given in Sha. In order to achieve the throughput requirement of the IEEE 802.3an standard, the p-parallel, p>1, decoder architecture presented in Sha should be used. However, the RS-LDPC code adopted in the standard is constructed by using discontinuous column selection and hence does not has the cyclic shift property Sha. The authors in Sha mentioned that their p-parallel, p>1, decoder architecture, can not be applied to RS-LDPC codes using discontinuous column selection. In contrast, using the proposed permutators with proper shift indices, the proposed shuffled iterative decoder can be applied to this kind of RS-LDPC codes.

For the proposed decoder and the decoder presented in Sha, a memory bank is used to store channel values, since the bandwidth requirement for these values is not high. In addition, the VNU units in both decoders are quite similar. In the proposed shuffled iterative decoder, registers are used to store the contents in both the ordered set and the index set for each row while in the TPMP-based decoder presented in Sha, two row result registers are respectively used to store the compressed C2V messages Sha produced at the current iteration and the previous iteration.

E. Comparison with LMPD-Based Decoder Using the Proposed Permutators

In layered MPD (LMPD), the check nodes (or equivalently rows of the PCM) are partitioned into several layers and each layer is processed sequentially and messages are exchanged among different layers in order to increase the convergence speed in BER performance. Naturally, horizontal scheduling is used for LMPD. A high-throughput LMPD-based decoder was presented in "High-throughput layered LDPC decoding architecture" reported by Z. Cui on IEEE Trans. Very Large Scale Integr. (VLSI) Syst., vol. 17, no. 4, pp. 582-587, April 2009 for rate-½ QC-LDPC code with low check node degree. The inputs of the permutators of the decoder presented in the above paper are APP values while the inputs of the permutators of the proposed decoder are the C2V messages. According to (19), the number of bits used to represent an APP value is larger than that of a C2V message. Consequently, using the proposed vertically-scheduled architecture to realize a multi-mode decoder, the word length of the permutator can be reduced. Using the proposed architecture to realize a single-mode decoder for the (2048, 1723) code, the permutation defined by Type-III submatrices can be realized by using only one barrel shifter and a routing network with fixed interconnections as described in Section IV.C. Using a horizontally-scheduled decoder, each permutator will deal with permutation defined by 64×64 sub-matrices belonging to the same block column of the PCM. Since neither the row shift indices $i_0$ nor the column shift indices $j_0$ are the same for these 64×64 sub-matrices, the permutation defined by Type-III sub-matrices can be realized by using two barrel shifters and a routing network with fixed interconnections in the LMPD-based horizontally-scheduled decoder. Based on these two considerations, a vertically-scheduled shuffled MPD is adopted in the proposed decoder.

V. Performance Evaluation

A. Implementation Results

Based on the proposed architecture, we have implemented two multi-mode decoders, which are respectively called Design A and Design B, in a UMC 90-nm CMOS process with nine metal layers for the eight RS-LDPC codes given in Table I. For Design A and Design B, $N_G=128$ and $N_G=64$, respectively. The number of quantization bits, including one sign bit, used for the channel values, C2V messages, and V2C messages are the same and are equal to 5.

Figure 11:
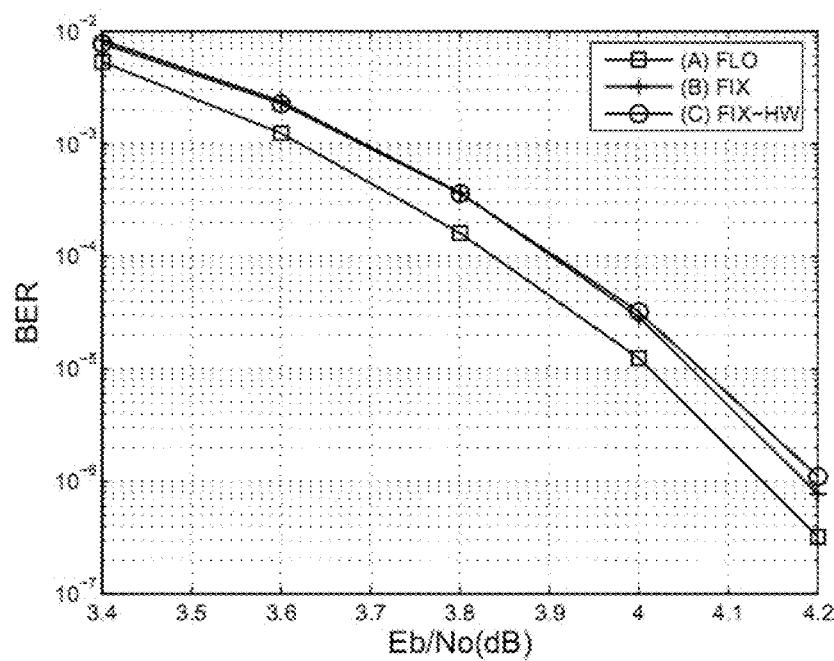
FIG. 11 shows the BER of the (6, 32)-regular (2048, 1723) code using $N_G=128$ and $N_{it}=18$.

FIG. 11 shows the BER results of the proposed decoder using $N_G=128$ for the (6, 32)-regular RS-LDPC code. Both fixed-point and floating-point results are given in FIG. 11. For the fixed-point results, the cases of both considering the effect of pipeline latency and not considering this effect are investigated. Remember that the shuffled MPD can achieve a faster convergence speed in BER compared to the TPMP, since in the shuffled MPD, the V2C messages produced at the current iteration can be used to calculate the C2V message at the same iteration. Specifically, according to (17), we can use $|Q_{j'i}[k]|$, $j'<(g+1) N_G$, values to calculate $|R_{ij}'[k]|$ when processing group g. However, in hardware implementation, due to the pipeline latency, some of $|Q_{j'i}[k]|$, $j'<(g+1) N_G$, values are not available and we can only use $|Q_{j'i}[k-1]|$ values, which are produced at the (k−1)-th iteration, to calculate $|R_{ij}'[k]|$. Consequently, the pipeline latency will slow down the convergence speed in BER. It can be seen from that FIG. 11 that Curve C, for which the effect of pipeline latency is considered, is slightly worse than that of Curve B, for which the effect is not considered, where the same number of iterations is used for Curves B and C. In addition, the loss due to the pipeline latency is less than 0.1 dB and the majority of the loss is resultant from the quantization effect. Similar conclusions can be made for the decoder using $N_G=64$.

Figure 12:
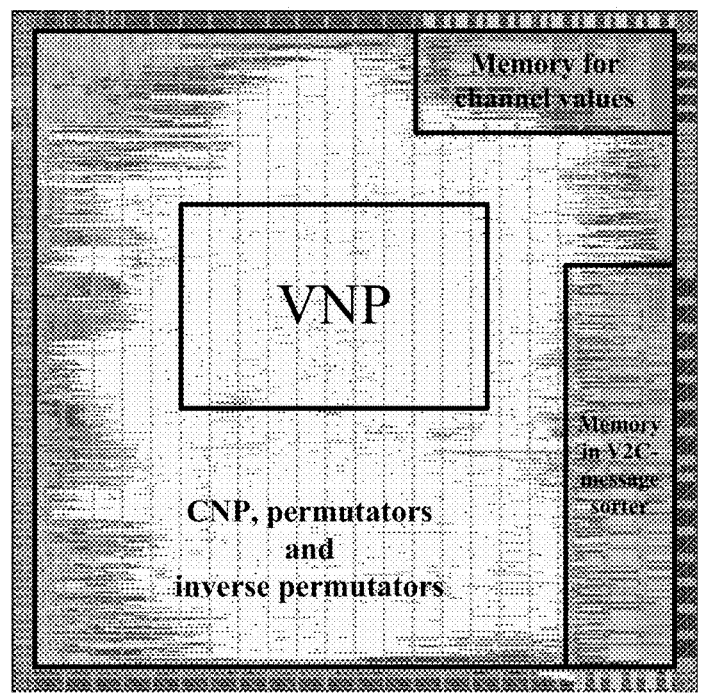
FIG. 12 shows the layout plot for Design A according to the invention.

Since complex inter-connections exist between the check-node units and the variable-node units, the fully-parallel single-mode decoder can only achieve a utilization of 50%. If a fully-parallel architecture is used to realize a multi-mode decoder, the complexity of the interconnections will be increased. In our partially-parallel multi-mode architecture, the channel values are read from the memory bank and are sent to the variable-node processor (VNP), no matter which group of columns is processed and which mode is operated. It can be seen from the layout plot shown in FIG. 12 that both the memory bank for the channel values and the VNP are centralized. Consequently, the interconnections between the memory bank and the VNP are simplified. Moreover, the routing congestion between the check-node units and variable-node units is mitigated by the permutators and inverse permutators. For Design A, the core area and core utilization are 2.1×2.1 mm$^2$ and 70%, respectively. Moreover, the critical-path delay is 3.3 ns. The throughput value when $N_{it}=8$ and $f_{clk}=303$ MHz is 4.85 Gbit/s. Table IV summarizes the implementation results for both designs. Preliminary power estimates for Designs A and B are also included in the table. The difference in power consumption for different decoding modes is small. Compared to Design A, Design B can achieve a higher utilization, a lower complexity and a lower power, but a lower throughput.

B. Comparison with Other RS-LDPC Decoders

In "Power reduction techniques for LDPC decoders" reported by A. Darabiha on IEEE J. Solid-State Circuits, vol. 43, no. 8, pp. 1835-1845, August 2008 (hereinafter referred as Darabiha-1), the authors presented a fully-parallel bit-serial MPD architecture to alleviate the routing complexity for LDPC decoders. The design in "Block-interlaced LDPC decoders with reduced interconnect complexity" reported by A. Darabiha on IEEE Trans. Circuits. Syst. II, Exp. Briefs, vol. 55, pp. 74-78, January 2008 (hereinafter referred as Darabiha) can achieve a high throughput by using a hard-decision decoding algorithm, where one-bit quantization is used. In "Multi-split-row threshold decoding implementations for LDPC codes" reported by T. Mohsenin in Proc. IEEE ISCAS 2009, pp. 2449-2452, May 2009 (hereinafter referred as Mohsenin), the authors proposed splitting the PCM into several sub-matrices, and also proposed a technique for improving the BER performance. In "Sliced message passing: high throughput overlapped decoding of high-rate low-density parity-check codes" reported by L. Liu on IEEE Trans. Circuits Syst. I, Reg. Papers, vol. 55, no. 11, pp. 3697-3710, December 2008 (hereinafter referred as Liu), a register-based partially-parallel decoding scheme, called sliced message passing (SMP), was proposed. In "A 47 Gb/s LDPC decoder with improved low error rate performance," reported by Z. Zhang in 2009 IEEE VLSI Circuits Symposium, Kyoto, Japan, June 2009 (hereinafter referred as Zhang), a high-throughput decoder with early termination was presented. In Sha, a low-complexity decoder for LDPC codes constructed based on the extended RS code using continuous column selection was presented. Table V compares this work (Design A) with the works presented in the above papers. Since a hard-decision decoding algorithm was adopted in Darabiha and the results of area and power consumption are not given in Sha, the results of the decoders in Darabiha and Sha are not included in Table V. Although the measured results of a (660, 484) LDPC code were reported in Darabiha-1, only the synthesis results were reported for the (2048, 1723) code. In Zhang, a decoder in a 65-nm process was presented. Using early termination, the decoder achieves a throughput value of 47.7 Gb/s based on the conditions of 1.2 V supply, $f_{clk}=700$ MHz, and a high SNR. The error floor performance (BER=10$^{-8}$) is improved through the post processor which occupies 13.7% total area. Although BER results are given in Zhang, the authors did not specify the number of iterations used in the BER evaluation. It can be seen from FIG. 8 that the proposed shuffled MPD using ω=3 and $N_{it}=8$ can achieve almost the same BER compared to the TPMP decoding using $N_{it}=12$. Based on the decoding latency given in Zhang, throughput at $N_{it}=12$ can be calculated and is given in Table V. In "Implementation of a flexible LDPC decoder" reported by G. Masera on IEEE Trans. Circuits. Syst. II, Exp. Briefs, vol. 54, no. 6, pp. 542-546, June 2007, the parameter TAR (throughput-to-area ratio) was introduced to make the comparison simple. The TAR value can be calculated according to TAR=(Throughput/Scaled area). For the decoders using a 65-nm process, the areas scaled to a 90-nm process, i.e., scaled areas, are calculated by using a normalization factor of 2. Since different algorithms are used in different decoders, the number of iterations required to achieve the same BER performance are not the same. Consequently, the number of iterations used in the calculation of the throughput should be based on the same BER performance.

Compared to the decoders presented in Darabiha-1 and Liu, the proposed decoder has a higher TAR value. Compared to the decoder in Zhang, the proposed decoder has a comparable TAR value. Compared to the fully-parallel split-row-16 threshold decoder in Darabiha-1, our partially-parallel decoder has a lower TAR value. Since the results of fixed-point BER are not given in Darabiha-1, we give the following comments based on the floating-point results presented in Darabiha-1. It can be seen that the error-performance loss of the split-row-16 threshold decoder is 0.21 dB at BER=$10^{-6}$ compared to TPMP using a modified MSA. From FIG. 8, it can be seen that using a shuffled MPD where ω=3 (Curve B) can achieve a gain of 0.08 dB at BER=$10^{-6}$ compared to TPMP using a modified MSA (Curve D). Consequently, the proposed shuffled MPD can provide better error performance compared to the threshold decoder. Moreover, compared to the decoders presented in the aforementioned papers in this paragraph, the proposed decoder achieves the best error performance even though a lower number of iterations is adopted. Finally, compared to the high-throughput decoders presented in the aforementioned papers, the most distinct feature of the proposed decoder is the multi-mode ability.

For comparison with the single-mode decoders in Table V, we implemented a single-mode decoder for the (2048, 1723) RS-LDPC code constructed based on the extended RS code using discontinuous column selection. In order to meet the throughput required by the standard, the decoding parallelism $N_G$ adopted is $N_G$=256. The proposed single-mode design achieves a throughput of 9.7 Gbit/s and consumes a power of 926.7 mW at a clock frequency of 303 MHz and $N_{it}$=8. In addition, this decoder occupies an area of 6.31 mm², and has a TAR value of 1537. The core utilization is 68%. Due to the following two reasons, the area of the proposed single-mode decoder using $N_G$=256 is not significantly increased compared to Design A, which is a multi-mode decoder using $N_O$=128. The first is that 4-bit quantization and 5-bit quantization are used in the single-mode and multi-mode decoders, respectively. The second is that each permutator (inverse permutator) in the single-mode decoder can be implemented by using a barrel shifter as described in Section IV.C, while most of permutators (inverse permutators) in the multi-mode decoder can be implemented by using two barrel shifters. The decoder using 4-bit quantization will have a error-performance loss of 0.1 dB at a BER of $10^{-6}$ compared to the decoder using 5-bit quantization. Compared to the single-mode decoders shown in Table V, the proposed single-mode decoder has the smallest scaled area. Consequently, the proposed architecture is quite suitable for the IEEE 802.3an applications, since the standard LDPC code is constructed based on the extended RS code using discontinuous column selection.

C. Comparison with Other Multi-Mode Decoders

In the literature, there are many multi-mode LDPC decoders for wireless applications such as DVB-S2, IEEE 802.16e, and IEEE 802.11n. Table VI shows the synthesis results presented in "Low complexity LDPC code decoders for next generation standards" reported by T. Brack in Proc. Des., Autom. Test Eur. (DATE '07), April 2007 (referred as Brack) for the LDPC codes specified in these standards. These multi-mode decoders are based on memory-shared partially-parallel architecture. Compared to the multi-mode decoders presented in the above paper, the proposed multi-mode decoder (Design B) provides fewer modes but achieves a higher throughput and a higher TAR value. The proposed multi-mode decoder supports only high-rate codes, which can be used for applications with relatively low-noise channels such as wire line communications or storage systems, where as many message bits as possible are required to be transmitted within a finite bandwidth. The proposed multi-mode decoder can be used in the above applications if flexible rate selection and error-correcting capability are desired.

In order to accommodate channels with lower SNR such as wireless channels, a code with lower rate is required. In fact, the proposed decoder architecture can support RS-LDPC codes constructed by using GF($2^6$) and γ=5 (or γ=6) as described in Section N.B. Based on this condition, three RS LDPC codes respectively with (γ, ρ)=(6, 11), (6, 14) and (6, 20) and rates 0.57, 0.65, and 0.75 were constructed. The code rates of these three codes are close to 0.5, 0.67, and 0.75, which are rates adopted by the WiMAX standard.

Figure 13:
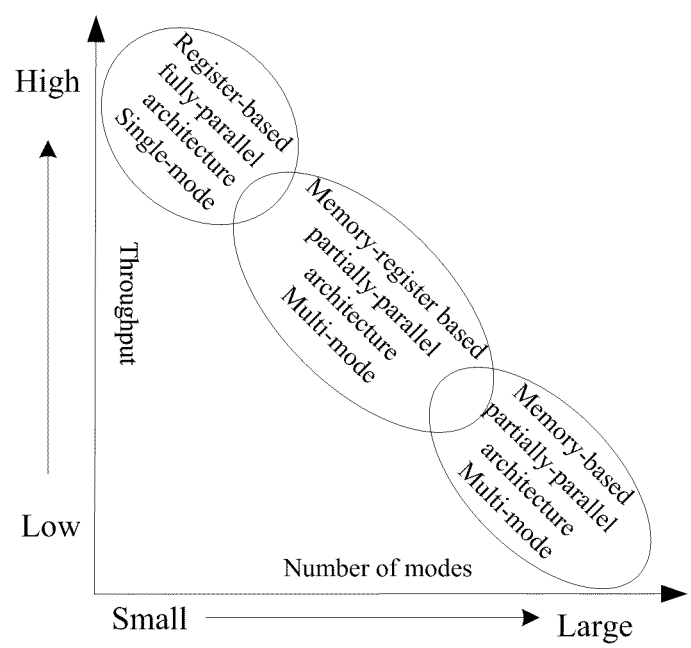
FIG. 13 shows the decoding architecture for a variety of requirements of throughput with different numbers of modes.

FIG. 13 shows the architecture for various throughput requirements with different number of modes. The register-based fully-parallel architecture achieves the highest throughput, but does not provide multi-mode functionality. The memory-based partially-parallel architecture can provide many modes (>8) but the throughput achieved is about 1 Gbit/s. Our partially-parallel architecture using a combination of memory and registers achieves both multi-mode and higher-throughput (>2 Gbit/s) requirements.

VI. Conclusions

In this invention, an efficient permutator design which can be used in multi-mode or single-mode RS-LDPC decoders is presented. A partially-parallel architecture using shuffled message-passing decoding is adopted in order to reduce the number of iterations required to achieve a given BER performance and to shorten the critical-path delay. Using the proposed architecture, we have implemented two multi-mode decoders and a single-mode (2048, 1723) decoder in a 90-nm process. Implementation results from post-layout simulation show that the multi-mode decoders achieve multi-Gbit/s throughput. In addition, the single-mode decoder, which only occupies an area of 6.31 mm², can achieve a throughput value near 10 Gbits/s.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

TABLE 1

| Code length (N) | Information length(K) | Column weight (γ) | Row weight | Code rate | $E_b/N_0$ (BER = $10^{-6}$) |
|---|---|---|---|---|---|
| 1536 | 1211 | 6 | 24 | 0.79 | 3.95 |
| 1536 | 1253 | 5 | 24 | 0.82 | 4.1 |
| 2048 | 1723 | 6 | 32 | 0.84 | 4.17 |
| 2048 | 1765 | 5 | 32 | 0.86 | 4.4 |
| 3072 | 2747 | 6 | 48 | 0.89 | 4.7 |
| 3072 | 2789 | 5 | 48 | 0.91 | 4.82 |
| 3968 | 3643 | 6 | 62 | 0.92 | 4.9 |
| 3968 | 3685 | 5 | 62 | 0.93 | 5.1 |

TABLE 2

| | Mode(s) | |
|---|---|---|
| | 8 | 1 |
| Code length (bit) | 1536-3968 | 2048 |
| Code rate | 0.79-0.93 | 0.84 |
| Overall logic gate count | 455K | 452K |
| Memory in V2C-message sorter (bit) | 23808 | 12288 |
| Memory for channel values (bit) | 19840 | 10240 |

TABLE 3

| Approach | MUX | This invention | MUX | This invention |
|---|---|---|---|---|
| Parallelism ($N_G$) | 64 | 64 | 256 | 256 |
| Gate count | 226K | 69K | 379K | 313K |
| Control bits | 3840 | 72 | 9216 | 288 |

TABLE 4

| | Design A | Design B |
|---|---|---|
| Parallelism ($N_G$) | 128 | 64 |
| Modes | 8 | 8 |
| Frequency (MHz) | 303 | 303 |
| Throughput (Gb/s) @ $N_{it}$ = 8 | 4.85 | 2.42 |
| Quantization | 5 | 5 |
| Permutator and inverse permutators | 302K | 150K |
| C2V-message calculator | 60K | 31K |
| V2C-message sorter | 297K | 205K |
| Variable-node processor | 142K | 69K |
| Overall logic gate count | 801K | 455K |
| Memory in V2C-message sorter (bit) | 23808 | 23808 |
| Memory for channel values (bit) | 19840 | 19840 |
| Core utilization | 70% | 75% |
| Core area (mm$^2$) | 4.41 | 2.75 |
| Estimated power (mW) | 803 | 437.7 |

TABLE 5

| | Zhang | Mohsenin | Darabiha-1 | Liu | This invention |
|---|---|---|---|---|---|
| Mode(s) | 1 | 1 | 1 | 1 | 8 |
| Code length | 2048 | 2048 | 2048 | 2048 | 1536-3968 |
| Code rate | 0.84 | 0.84 | 0.84 | 0.84 | 0.79-0.93 |
| Edges | 12288 | 12288 | 12288 | 12288 | 7680-23808 |
| Scheme | TPMP-OMSA | Split-16 | Bit-serial | SMP | Shuffled MPD |
| Architecture | Partially Parallel | Fully Parallel | Fully Parallel | Partially Parallel | Partially Parallel |
| Process | 65 nm | 65 nm | 90 nm | 90 nm | 90 nm |
| Quantization | 4 | N/A | 4 | 5 | 5 |
| Critical-path (ns) | N/A | 10 | 4 | 4.83 | 3.3 |
| $f_{clk}$(MHz) | 700 | 100 | 250 | 207 | 303 |
| $E_b/N_0$ (dB) | N/A | N/A | 4.75 | 4.7 | 4.2 |
| $N_{it}$ | 12 | 15 | 16 | 16 | 8 |
| Throughput (Gb/s) | 9.97 | 13.8 | 8 | 5.3 | 4.85 |
| Area (mm$^2$) | 5.35 | 3.8 | 9.8 | 14.5 | 4.41 |
| Scaled Area (mm$^2$) | 10.7 | 7.6 | 9.8 | 14.5 | 4.41 |
| TAR | 932 | 1815 | 816 | 366 | 1100 |
| Power (mW) | 2800 | N/A | N/A | N/A | 803 |

TABLE 6

| | Brack | | | This invention |
|---|---|---|---|---|
| Codes | DVB-S2 | 802.16e | 802.11n | RS-LDPC |
| Modes | 11 | 114 | 12 | 8 |
| Code length | 64800 | 576-2304 | 648-1944 | 1536-3968 |
| Code rate | 0.25-0.9 | 0.5-0.83 | 0.5-0.83 | 0.79-0.93 |
| Quantization | 6 | 6 | 6 | 5 |
| $f_{clk}$(MHz) | 400 | 400 | 400 | 303 |
| Max throughput (Gb/s) @ $N_{it}$ = 8 | 1.474 | 0.998 | 0.843 | 2.42 |
| Process | 65 nm | 65 nm | 65 nm | 90 nm |
| Area (mm$^2$) | 3.861 | 1.337 | 1.023 | 2.75 |
| Scaled area (mm$^2$) | 7.722 | 2.674 | 2.046 | 2.75 |
| TAR (Mbps/mm$^2$) | 191 | 373 | 412 | 880 |
| Power (mW) | N/A | N/A | N/A | 437.7 |

What is claimed is:

1. A decoder for a low-density parity check (LDPC) code constructed based on a Reed-Solomon (RS) code, comprising:
a permutation circuit for providing configurable connections defined by a sub-matrix $B(i_0, j_0)$ in a parity check matrix, the parity check matrix being related to a Galois field $GF(p^s)$, wherein p is a prime, s is a positive integer, $i_0$ and $j_0$ are integer indices ranging from 0 to $(p^s-1)$, a set of input comprising $p^s$ elements, the permutation circuit comprising:
a first permutator for fixing the first element in the set of input and cyclically shifting the other $(p^s-1)$ elements in the set of input by $j_0$ positions, so as to generate a first set of temporary elements;
a fixed routing, for rearranging the first set of temporary elements, so as to generate a second set of temporary elements; and
a second permutator for fixing the first element in the second set of temporary elements and cyclically shifting the remaining $(p^s-1)$ elements of the second set of temporary elements by $i_0$ positions.

2. The decoder in claim 1, the decoder being in a receiver conforming to a 10-gigabit Ethernet specification.

3. The decoder in claim 1, wherein when the LDPC code is an extended RS code, $(p^s-1)$ connections in the second permutator for cyclically shifting the $(p^s-1)$ elements of the second set of temporary elements are fixed.

4. The decoder in claim 1, the decoder using column scheduling and comprising a plurality of the permutation circuits, wherein when the LDPC code is an extended RS code, the integer indices $i_0$ in the permutation circuits are the same, the first permutator comprises a barrel shifter, and the second permutator comprises plural fixed connections.

5. The decoder in claim 1, wherein the first permutator and the second permutator respectively comprise a barrel shifter.

6. The decoder of claim 1, wherein the parity check matrix comprises $\gamma \times \rho$ sub-matrices, the first $(\rho-1)$ sub-matrices in a first block row of the parity check matrix are type-I sub-matrices, the $\gamma$ sub-matrices in a last block column of the parity check matrix are type-II sub-matrices, and the other $(\gamma-1) \times (\rho-1)$ sub-matrices in the parity check matrix are type-III sub-matrices, $\gamma$ and $\rho$ are positive integers, and the sub-matrix $B(i_0, j_0)$ is one of the type-I sub-matrices or the type-III sub-matrices.

7. The decoder of claim 1, further comprising:

a check-node operation module for generating a check-to-variable message $R_{ij}[k]$ associated with a j-th variable node for an i-th check node at a k-th iteration according to the following equation:

$$R_{ij}[k]=S_{ij}[k]\times\max\{(|R_{ij}'[k]|-\delta),0\},$$

wherein $S_{ij}[k]$ is a positive/negative sign of $R_{ij}[k]$, $\delta$ is an offset constant, the check-node operation module selects $|R_{ij}'[k]|$ from $\{|Q_{j_0 i}|, |Q_{j_1 i}|, \ldots, |Q_{j_{\omega-1} i}|\}$;

wherein $\{|Q_{j_0 i}|, Q_{j_1 i}|, \ldots, |Q_{j_{\omega-1} i}|\}$ are the $\omega$ smallest values among a plurality of variable-to-check messages associated to the i-th check node;

wherein i is an integer index ranging from 0 to (M−1), j is an integer index ranging from 0 to $|I_R[i]|$, k is an iteration number, $\omega$ is an integer ranging from 3 to $(|I_R[i]|-1)$, M is the number of rows of the parity check matrix, and $|I_R[i]|$ is the i-th row weight of the parity check matrix.

8. The decoder of claim 7, wherein $|Q_{j_0 i}|, Q_{j_1 i}|, \ldots, |Q_{j_{\omega-1} i}|$ are generated in the k-th iteration or a (k−1)-th iteration previous to the k-th iteration.

9. The decoder of claim 7, wherein the (k+1)-th iteration is aborted if the most significant bit of the absolute value of $R_{ij}[k]$ is equal to 1.

10. A decoding method for low-density parity check (LDPC) codes constructed based on Reed-Solomon (RS) codes, a parity check matrix being related to a Galois field $GF(p^s)$, p being a prime, s being a positive integer, $i_0$ and $j_0$ being integer indices ranging from 0 to $(p^s-1)$, a set of input comprising $p^s$ elements, the decoding method comprising the following steps:

for the set of input, providing configurable rearrangements defined by a sub-matrix $B(i_0, j_0)$ in the parity check matrix by:

fixing the first element in the set of input and cyclically shifting the other $(p^s-1)$ elements in the set of input by $j_0$ positions, so as to generate a first set of temporary elements;

rearranging the first set of temporary elements, so as to generate a second set of temporary elements; and fixing the first element in the second set of temporary elements and cyclically shifting the remaining $(p^s-1)$ elements of the second set of temporary elements by $i_0$ positions.

11. The decoding method in claim 10, the decoding method is applied in a receiver conforming to a 10-gigabit Ethernet specification.

12. The decoding method in claim 10, wherein cyclically shifting in the steps are performed by barrel shifting.

13. The decoding method of claim 10, wherein the parity check matrix comprises $\gamma\times\rho$ sub-matrices, the first $(\rho-1)$ sub-matrices in a first block row of the parity check matrix are type-I sub-matrices, the $\gamma$ sub-matrices in a last block column of the parity check matrix are type-II sub-matrices, and the other $(\gamma-1)\times(\rho-1)$ sub-matrices in the parity check matrix are type-III sub-matrices, the sub-matrix $B(i_0, j_0)$ is one of the type-I sub-matrices or the type-III sub-matrices.

14. The decoding method of claim 10, further comprising:

generating a check-to-variable message $R_{ij}[k]$ associated with a j-th variable node for an i-th check node at a k-th iteration according to the following equation:

$$R_{ij}[k]=S_{ij}[k]\times\max\{(|R_{ij}'[k]|-\delta),0\},$$

wherein $S_{ij}[k]$ is a positive/negative sign of $R_{ij}[k]$, $\delta$ is an offset constant, and $|R_{ij}'[k]|$ is selected from $\{|Q_{j_0 i}|, |Q_{j_1 i}|, \ldots, |Q_{j_{\omega-1} i}|\}$;

wherein $\{|Q_{j_0 i}|, |Q_{j_1 i}|, \ldots, |Q_{j_{\omega-1} i}|\}$ are the $\omega$ smallest values among a plurality of variable-to-check messages associated to the i-th check node;

wherein i is an integer index ranging from 0 to (M−1), j is an integer index ranging from 0 to $|I_R[i]|$, k is an iteration number, $\omega$ is an integer ranging from 3 to $(|I_R[i]|-1)$, M is the number of rows of the parity check matrix, and $|I_R[i]|$ is the i-th row weight of the parity check matrix.

15. The decoding method of claim 14, wherein $|Q_{j_0 i}|, |Q_{j_1 i}|, \ldots, |Q_{j_{\omega-1} i}|$ are generated in the k-th iteration or a (k−1)-th iteration previous to the k-th iteration.

16. The decoding method of claim 14, wherein the (k+1)-th iteration is aborted if the most significant bit of the absolute value of $R_{ij}[k]$ is equal to 1.

* * * * *